United States Patent [19]
Kikuchi et al.

[11] Patent Number: 6,081,208
[45] Date of Patent: Jun. 27, 2000

[54] IMAGE INFORMATION ENCODING/ DECODING SYSTEM

[75] Inventors: Shinichi Kikuchi, Yokohama; Tetsuya Kitamura, Kamae; Hideki Mimura; Kazuhiko Taira, both of Yokohama, all of Japan

[73] Assignee: Kabushiki Kaisha Toshiba, Kawasaki, Japan

[21] Appl. No.: 08/806,685

[22] Filed: Feb. 26, 1997

Related U.S. Application Data

[62] Division of application No. 08/577,100, Dec. 22, 1995.

[30] Foreign Application Priority Data

Dec. 28, 1994 [JP] Japan .................................. 6-327460

[51] Int. Cl.[7] ....................................................... H03M 7/00
[52] U.S. Cl. ............................................................. 341/50
[58] Field of Search ............................... 341/50, 55, 106, 341/67; 386/109, 45; 348/584, 581; 345/121

[56] References Cited

U.S. PATENT DOCUMENTS

| | | |
|---|---|---|
| 3,184,542 | 5/1965 | Horsley . |
| 3,347,981 | 10/1967 | Kagan et al. . |
| 4,360,840 | 11/1982 | Wolfrum . |
| 4,467,354 | 8/1984 | Eby, Jr. . |
| 4,586,027 | 4/1986 | Tsukiyama . |
| 4,602,383 | 7/1986 | Ogawa et al. . |
| 4,673,977 | 6/1987 | Stelzenmuller . |
| 4,680,647 | 7/1987 | Moriyama . |
| 4,736,258 | 4/1988 | Noble . |
| 4,752,832 | 6/1988 | Higurashi . |
| 4,783,834 | 11/1988 | Anderson et al. . |

(List continued on next page.)

FOREIGN PATENT DOCUMENTS

| | | |
|---|---|---|
| 0205944 | 12/1986 | European Pat. Off. . |
| 0 644 692 A2 | 3/1995 | European Pat. Off. . |
| 0 661 888 A2 | 7/1995 | European Pat. Off. . |
| 61-131684 | 6/1986 | Japan . |
| 2211774 | 8/1990 | Japan . |
| 4-276983 | 10/1992 | Japan . |
| 4-286289 | 10/1992 | Japan . |
| 4-368670 | 12/1992 | Japan . |
| 5-14859 | 1/1993 | Japan . |
| 5-145889 | 6/1993 | Japan . |
| 6-124168 | 5/1994 | Japan . |
| 7-203447 | 11/1994 | Japan . |
| 7-15729 | 1/1995 | Japan . |
| 7-21685 | 1/1995 | Japan . |
| 7-30886 | 1/1995 | Japan . |
| 7-46198 | 2/1995 | Japan . |
| 7-87444 | 3/1995 | Japan . |
| 7-107433 | 4/1995 | Japan . |
| 7-282544 | 10/1995 | Japan . |
| 8-111642 | 1/1996 | Japan . |
| 8-63884 | 3/1996 | Japan . |
| 8-65169 | 3/1996 | Japan . |

OTHER PUBLICATIONS

Eiselen et al., "Image Compression," IBM Technical Disclosure Bulletin, vol. 14, No. 8, Jan. 1972.
Renelt, "Easily Decodable Runlength Code (E.D.R.C.) for Source Encoding of Black–and–White Facsimile Pictures," Electronics Letters, vol. 12, No. 23, Nov. 11, 1976.
Peake, "Parallel Decoding of Variable Length Codewords," IBM Technical Disclosure Bulletin, vol. 20, No. 12, May 1978.

*Primary Examiner*—Brian Young
*Attorney, Agent, or Firm*—Pillsbury Madison & Sutro LLP

[57] ABSTRACT

A bit train of a plurality of continuous pixels is compressed according to a new run-length compression scheme. In this run-length compression scheme, the run information of one unit of compression includes run-length information indicating the continuous number of the same pixel data blocks, or the number of pixels followed, and pixel data having a two-bit configuration for discriminating three or more colors of the pixels.

23 Claims, 25 Drawing Sheets

U.S. PATENT DOCUMENTS

| | | |
|---|---|---|
| 4,811,113 | 3/1989 | Ozeki . |
| 4,872,009 | 10/1989 | Tsukiyama . |
| 4,918,523 | 4/1990 | Simon . |
| 4,922,273 | 5/1990 | Yonekawa et al. . |
| 5,040,061 | 8/1991 | Yonemitsu . |
| 5,040,233 | 8/1991 | Davy et al. . |
| 5,086,487 | 2/1992 | Katayama et al. . |
| 5,097,518 | 3/1992 | Scott et al. . |
| 5,140,437 | 8/1992 | Yonemitsu . |
| 5,224,087 | 6/1993 | Maeda . |
| 5,225,904 | 7/1993 | Golin . |
| 5,243,588 | 9/1993 | Maeda . |
| 5,245,600 | 9/1993 | Yamauchi . |
| 5,253,053 | 10/1993 | Chu et al. . |
| 5,270,812 | 12/1993 | Richards . |
| 5,270,828 | 12/1993 | Mogi . |
| 5,282,049 | 1/1994 | Hatakenaka . |
| 5,282,186 | 1/1994 | Yoshio et al. . |
| 5,283,656 | 2/1994 | Sugahara . |
| 5,294,997 | 3/1994 | Ogura . |
| 5,315,670 | 5/1994 | Shapiro . |
| 5,321,776 | 6/1994 | Shapiro . |
| 5,325,297 | 6/1994 | Bird . |
| 5,357,546 | 10/1994 | Meriwether . |
| 5,363,362 | 11/1994 | Maeda . |
| 5,371,602 | 12/1994 | Tsuboi . |
| 5,379,356 | 1/1995 | Purcell et al. . |
| 5,388,093 | 2/1995 | Yoshida . |
| 5,390,158 | 2/1995 | Furuhashi . |
| 5,400,315 | 3/1995 | Koishi . |
| 5,408,542 | 4/1995 | Callahan . |
| 5,424,850 | 6/1995 | Inoue . |
| 5,448,368 | 9/1995 | Rijckaert . |
| 5,450,209 | 9/1995 | Niimura . |
| 5,453,967 | 9/1995 | Aramaki . |
| 5,457,667 | 10/1995 | Kojima . |
| 5,461,423 | 10/1995 | Tsukagoshi . |
| 5,490,130 | 2/1996 | Akagiri . |
| 5,508,816 | 4/1996 | Ueda . |
| 5,535,008 | 7/1996 | Yamagishi . |
| 5,539,716 | 7/1996 | Furuhashi . |
| 5,552,832 | 9/1996 | Astle . |
| 5,758,007 | 5/1998 | Kitaura et al. ............ 386/45 |
| 5,845,021 | 12/1998 | Kikuchi et al. . |

DATA FOR VIDEO

FIG. 4A

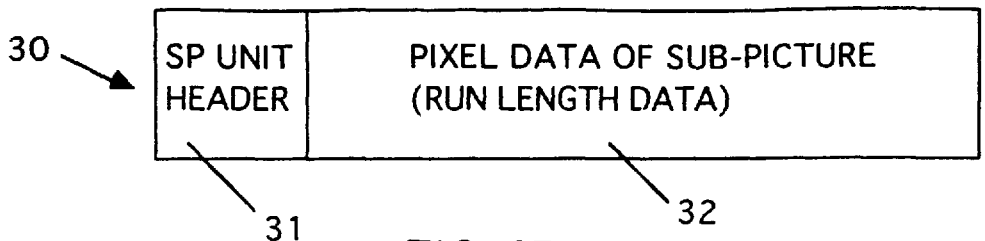

30 → | SP UNIT HEADER | PIXEL DATA OF SUB-PICTURE (RUN LENGTH DATA) |

| PARAMETER | CONTENTS |
|---|---|
| SPDDADR | START ADR. OF SUB-PICTURE DISPLAY DATA (RUN-LENGTH DATA) |
| SPEDADR | END ADR. OF SUB-PICTURE DISPLAY DATA (RUN-LENGTH DATA) |
| SPDSIZE | START POS., WIDTH & HEIGHT OF SUB-PICTURE (=SP) TO BE DISPLAYED |
| SPCHI | BACKGROUND COLOR INFO. (COLOR PALETTE NO.) |
| SPCINFO | COLOR INFO. (COLOR PALETTE NO.) OF SP |
| SPADJINFO | EMPHASIZING COLOR INFO. (PALETTE NO.) OF SP |
| SPMOD | MODE INFO. OF SP |
| SPCONT | MIXING RATIO OF SP TO MAIN PICTURE (=MP) |
| SPDST | TIMING OF START OF SP (FRAME NO. OF MP) |
| SPLine 1 | START ADR. OF SP DATA ON 1ST. LINE |
| SPLine 2 | START ADR. OF SP DATA ON 2ND. LINE |
| ⋮ | |
| SPLine N | START ADR. OF SP DATA ON NTH. LINE |

COMPRESSION RULE 1 (FOR CONTINUOUS 1-3 PIXELS)

| CODING HEADER (0 BITS) | NUMBER OF PIX FOLLOWED (2 BITS) | PIXEL DATA (2 BITS) |
|---|---|---|

FIG. 5A

COMPRESSION RULE 2 (FOR CONTINUOUS 4-15 PIXELS)

| CODING HEADER (2 BITS) | NUMBER OF PIX FOLLOWED (4 BITS) | PIXEL DATA (2 BITS) |
|---|---|---|

FIG. 5B

COMPRESSION RULE 3 (FOR CONTINUOUS 16-63 PIXELS)

| CODING HEADER (4 BITS) | NUMBER OF PIX FOLLOWED (6 BITS) | PIXEL DATA (2 BITS) |
|---|---|---|

FIG. 5C

COMPRESSION RULE 4 (FOR CONTINUOUS 64-255 PIXELS)

| CODING HEADER (6 BITS) | NUMBER OF PIX FOLLOWED (8 BITS) | PIXEL DATA (2 BITS) |
|---|---|---|

FIG. 5D

COMPRESSION RULE 5
(FOR CONTINUOUS PIXELS UP TO THE END OF LINE)

| CODING HEADER (14 BITS) | PIXEL DATA (2 BITS) |
|---|---|

FIG. 5E

COMPRESSION RULE 6 (FOR BYTE-ALIGNING)

| COMPRESSED DATA (NOT BYTE-ALIGNED) | DUMMY (4 BITS) |
|---|---|

FIG. 5F

COMPRESSION RULE 11 (FOR CONTINUOUS 1-7 PIXELS)

| CODING HEADER (0 BITS) | NUMBER OF PIX FOLLOWED (3 BITS) | PIXEL DATA (1 BIT) |
|---|---|---|

FIG. 6A

COMPRESSION RULE 12 (FOR CONTINUOUS 8-15 PIXELS)

| CODING HEADER (3 BITS) | NUMBER OF PIX FOLLOWED (4 BITS) | PIXEL DATA (1 BIT) |
|---|---|---|

FIG. 6B

COMPRESSION RULE 13 (FOR CONTINUOUS 16-127 PIXELS)

| CODING HEADER (4 BITS) | NUMBER OF PIX FOLLOWED (7 BITS) | PIXEL DATA (1 BIT) |
|---|---|---|

FIG. 6C

COMPRESSION RULE 14
(FOR CONTINUOUS PIXELS UP TO THE END OF LINE)

| CODING HEADER (7 BITS) | PIXEL DATA (1 BIT) |
|---|---|

FIG. 6D

COMPRESSION RULE 15 (FOR BYTE-ALIGNING)

| COMPRESSED DATA (NOT BYTE-ALIGNED) | DUMMY (4 BITS) |
|---|---|

FIG. 6E

FIG. 7A LINE START · · · LINE END — BEFORE COMPRESSED

| | |
|---|---|
| 1ST LINE | · · · o # o · · · o # # # # o · |
| 2ND LINE | · · o # # # o · · o # o o o # o |
| 3RD LINE | · o # # o # # o · o # o o o # o |
| 4TH LINE | · o # o o o # o · o # # # # o · |
| 5TH LINE | · o # # # # # o · o # o o o # o |
| 6TH LINE | · o # o o o # o · o # o o o # o |
| 7TH LINE | · o # o · o # o · o # # # # o · |
| 8TH LINE | · o o o · o o o · o o o o o · · |
| 9TH LINE | · · · · · · · · · · · · · · · · |

· = BACKGROUND COLOR PIXEL 2-BIT (00)

# = CHARACTER COLOR PIXEL 2-BIT (01)

o = EMPHASIZING COLOR PIXEL 2-BIT (10)

FIG. 7B LINE START                                               LINE END

| | |
|---|---|
| 1ST LINE | · *3 / o *1 / # *1 / o *1 / · *3 / o *1 / # *4 / o *1 / · *1 |
| 2ND LINE | · *2 / o *1 / # *3 / o *1 / · *2 / o *1 / # *1 / o *3 / # *1 / o *1 |
| ⋮ | ⋮ |
| 8TH LINE | · *1 / o *3 / · *1 / o *3 / · *1 / o *5 / · *2 |
| 9TH LINE | · *16 |

FIG. 7C LINE START                                               LINE END

| | |
|---|---|
| 1ST LINE | 1100 0110 0101 0110 1100 0110 00010001 0110 0100 |
| 2ND LINE | 1000 0110 1101 0110 1000 0110 0101 1110 0101 0110 |
| ⋮ | ⋮ |
| 8TH LINE | 0100 1110 1101 1110 0100 00010110 1000 |
| 9TH LINE | 0000 0000 0000 0000 |

AFTER COMPRESSED

FIG. 8A ENCODED DATA (RUN-LENGTH COMPRESSED)

| 1ST LINE | 1100 0110 0101 0110 1100 |
|---|---|
| 2ND LINE | 1000 0110 1101 0110 1000 |
| ⋮ | ⋮ |
| 8TH LINE | 0100 1110 1101 1110 0100 |
| 9TH LINE | 0000 0000 0000 0000 |

FIG. 8B

| 1ST LINE | · · · o # o · · · |
|---|---|
| 2ND LINE | · · o # # # o · · |
| 3RD LINE | · o # # o # # o · |
| 4TH LINE | · o # o o o # o · |
| 5TH LINE | · o # # # # # o · |
| 6TH LINE | · o # o o o # o · |
| 7TH LINE | · o # o · o # o · |
| 8TH LINE | · o o o · o o o · |
| 9TH LINE | · · · · · · · · · |

NON-INTERLACED DISPLAY OF DECODED DATA

FIG. 8C

| LINE#01<br>LINE#10 | · · · o # o · · ·<br>· · · o # o · · · |
|---|---|
| LINE#02<br>LINE#11 | · · o # # # o · ·<br>· · o # # # o · · |
| LINE#03<br>LINE#12 | · o # # o # # o ·<br>· o # # o # # o · |
| LINE#04<br>LINE#13 | · o # o o o # o ·<br>· o # o o o # o · |
| LINE#05<br>LINE#14 | · o # # # # # o ·<br>· o # # # # # o · |
| LINE#06<br>LINE#15 | · o # o o o # o ·<br>· o # o o o # o · |
| LINE#07<br>LINE#16 | · o # o · o # o ·<br>· o # o · o # o · |
| LINE#08<br>LINE#17 | · o o o · o o o ·<br>· o o o · o o o · |
| LINE#09<br>LINE#18 | · · · · · · · · ·<br>· · · · · · · · · |

INTERLACED DISPLAY OF DECODED DATA

IMAGE INFORMATION ENCODING/DECODING SYSTEM

This is a Divisional application of Ser. No. 08/577,100 filed Dec. 22, 1995.

BACKGROUND OF THE INVENTION

1. Field of the Invention

The present invention relates to the following methods, devices, apparatuses, and systems:

(1) an encoding method of compressing/encoding recorded digital image data such as caption data or simple animated cartoon data;

(2) a decoding method of decoding the compressed/encoded data;

(3) a compression/expansion system as a combination of the above encoding and decoding methods;

(4) a recording medium (two-sided or double-sided high-density optical disk) on which information is recorded by the above encoding method;

(5) a device (an integrated circuit or the like) for performing signal processing based on the encoding method;

(6) a device (an integrated circuit or the like) for performing signal processing based on the decoding method;

(7) a recording apparatus for recording various pieces of information on a recording medium by the encoding method;

(8) a playing back apparatus for playing back the information from the recording medium by the decoding method;

(9) a broadcasting/distributing system for broadcasting/distributing various pieces of information, which are compressed/encoded by the encoding method, by radio or wire; and

(10) an electronic mail system for exchanging various pieces of information, which are compressed/encoded by the encoding method, by radio or via network lines (e.g., internet lines) using wires.

2. Description of the Related Art

As methods of compressing and recording or communicating image data such as caption data, the following conventional methods are known.

The first method is a character code conversion method, in which text data is separated for every other word, and character codes corresponding to the respective words are recorded or communicated as data. Currently, as character codes, 2-byte codes used for Japanese and 1-byte codes used for English are widely used. As Japanese codes, JIS codes, shift JIS codes, and the like are used. As English codes, ASCII codes and the like are used.

In the first method, a character font ROM corresponding to each character code set must be prepared in the image playing back apparatus. A character code which does not correspond to any one of the character font ROMs cannot be played back. For this reason, in order to allow the image playing back apparatus to handle a plurality of languages, a character font ROM is required for each language.

The second method is a method of reading test data as image data and encoding the data to compress the entire data. As a typical example of this encoding method, a run-length compression method is known.

In the run-length compression method, the length of continuous pixels of continuous identical data of pixel data obtained by scanning text data line by line is converted into a run-length code, and the resultant data is recorded or transmitted.

Consider a pixel data line like "aaaabbbbbbbcccccdd". According to the run-length compression method, this data line is converted into data (run-length compressed code) like "a4, b7, c5, d2" consisting of pieces of pixel information (a, b, c, and d) and the numbers of pixels followed (4, 7, 5, and 2) indicating the numbers of pieces of pixel information.

As methods of further converting this run-length compressed code into a binary code, modified Huffman codings and arithmetic codings are known.

Modified Huffman codes (to be abbreviated to MH codes) used as standard codes in facsimile apparatuses will be briefly described first. Note that MH codes are used only when the contents of image information, i.e., pixels, have two colors, i.e., black and white.

A data file is converted into MH codes by using an algorithm which is designed such that a binary bit code having a small number of bits (i.e., a simple code) is assigned to data with a statistically high frequency of use (i.e., frequently used data), and a binary bit code having a large number of bits (i.e., a complicated code) is assigned to data with a low frequency of use (i.e., rarely used data) so as to reduce the total data amount of the data file.

In MH codings, as the number of types of data to be encoded increases, a corresponding code table increases in size. In addition, complicated code tables corresponding to the number of data to be encoded are required in both an encoder and a decoder.

For this reason, MH codings in a multilingual system handling various languages lead to great increases in the costs of both the encoder and the decoder.

Arithmetic codings will be described next.

In performing arithmetic codings, first of all, data is read, and the frequency of use of each data is checked. Codes having small numbers of bits are then assigned to the data in the order of decreasing frequencies of use so as to form a code table. The code table formed in this manner is recorded (or transmitted) as data. Thereafter, the data is encoded on the basis of this code table.

In arithmetic codings, although a code table must be recorded or transmitted, data can be formed by using a code table optimal for the contents of a file to be recorded or transmitted. In addition, in arithmetic codings, complicated code tables are not required in both an encoder and a decoder, unlike in MH codings.

In arithmetic codings, however, since a code table is formed in encoding data, the data must be read twice, and decoding processing is complicated.

U.S. Pat. No. 4,811,113 discloses an image encoding method other than the above two methods. In this method, a flag bit representing the number of bits as a code data length is prepared before a run-length code, and encoding and decoding are performed while an integer multiple of the value of the flag bit is regarded as a code data length.

In this method, since a data length is calculated from a flag bit, a large code table is not required, unlike in MH codings. However, the internal circuit arrangement of a decoder tends to be complicated because of hardware for calculating a code data length.

In addition, in this method, although monochrome (black and white) data can be encoded/decoded as in MH codings, multi-color image data cannot be compressed without any improvement.

SUMMARY OF THE INVENTION

It is the first object of the present invention to provide an image information encoding method which can eliminate the drawback (necessity to use large code tables) of MH codings, the drawback (necessity to read data twice) of arithmetic codings, and the drawback (inability to compress multi-color image data) of the flag-bit-attached run-length coding method (U.S. Pat. No. 4,811,113) at practical level.

It is the second object of the present invention to provide a decoding method of decoding data encoded in accordance with the first object.

It is the third object of the present invention to provide a compression/expansion system based on a combination of the encoding (compression) method and the decoding (expansion) method according to the first and second objects.

It is the fourth object of the present invention to provide a recording medium (e.g., a two-sided high-density optical disk) on which information is recorded by the encoding method according to the first object.

It is the fifth object of the present invention to provide a device (e.g., an integrated circuit) for performing signal processing based on the encoding method according to the first object.

It is the sixth object of the present invention to provide a device (e.g., an integrated circuit) for performing signal processing based on the decoding method according to the second object.

It is the seventh object of the present invention to provide a recording apparatus for recording various pieces of information on a recording medium (e.g., a two-sided high-density optical disk) by the encoding method according to the first object.

It is the eight object of the present invention to provide a playing back apparatus for playing back information recorded on the above recording medium by the decoding method according to the second object.

It is the ninth object of the present invention to provide a broadcasting/distributing system for broadcasting/distributing various pieces of information, which are compressed/encoded by the encoding method according to the first object, by radio or wire.

It is the tenth object of the present invention to provide an electronic mail system for exchanging various pieces of information, which are compressed/encoded by the encoding method according to the first object, by radio or via network lines (e.g., internet lines) using wires.

To achieve the above-mentioned first object, according to an encoding method of the present invention, an information integral body (e.g., PXD in FIG. 9, or SPD in FIG. 10), formed of a plurality of pixel data each defined by a predetermined number of bits (e.g., 2-bit), is processed so that a data block, containing the same continuous pixel data, is compressed as one unit of compression (e.g., any of CU01 to CU04 in FIG. 9). The encoding method comprises the steps of:

a compression data specifying step (e.g., ST801 in FIG. 13) for specifying the data block of the one compression unit (CU01–CU04) of the information integral body (PXD/SPD); and a compression data generating step (e.g., ST806 in FIG. 13, or ST908 to ST914 in FIG. 14) for generating a compressed unit data block (e.g., CU01* to CU04* in FIG. 9) in accordance with a coding header (e.g., 0-bit to 6-bit of rules 1 to 4 in FIG. 5) corresponding to a continuing number (e.g., any of 1 to 255) of the same pixel data in the data block of the one compression unit, with a number of pixels followed (e.g., 2-bit to 8-bit) indicating the continuing number (1–255) of the same pixel data, and with data (e.g., 2-bit) representing the same pixel data in the data block of the one compression unit.

To achieve the above-mentioned second object, according to a decoding method of the present invention, a bit train of one unit of a compressed data block, obtained by compressing the same continuous pixel data as one unit of compression, is expanded (e.g., ST1005 in FIG. 15), wherein the compressed data block corresponds to at least part of an information integral body (e.g., PXD in FIG. 9, or SPD in FIG. 10) formed by a plurality of pixel data each defined by a predetermined number of bits (e.g., 2-bit), and the compressed data block includes a coding header indicating data of a number of pixels followed, which number data corresponds to the number of the same continuous pixel data, or includes a coding header indicating the number data of pixels followed as well as the same continuous pixel data thereof. The decoding method comprises the steps of:

a coding header detecting step (e.g., ST1101 to ST1109 in FIG. 16) for detecting the coding header from the data block (e.g., any of CU01* to CU04* in FIG. 9) of the one compression unit contained in the information integral body (PXD/SPD);

a continuous pixel number detecting step (e.g., ST1110 to ST1113 in FIG. 16) for detecting the number data of the pixels followed (e.g., any of 2-bit to 8-bit in FIG. 5, or data length of zero as in the case of rule 5 in FIG. 5; the zero data length will not affect on a later subtraction), from the data block (e.g., any of CU01* to CU04* in FIG. 9) of the one compression unit, in accordance with a content of the coding header (e.g., data length of any of 0-bit to 6-bit at rules 1 to 4 in FIG. 5; the data length of 0-bit as in the case of rule 1 will not affect on a later subtraction) detected by the coding header detecting step (ST1101 to ST1109);

a pixel data determining step (e.g., ST1114 in FIG. 16) for determining a content (e.g., any of "00", "01", "10", "11") of the pixel data in an uncompressed data block (e.g., any of CU01 to CU04 in FIG. 9) of the one compression unit, in accordance with a remainder (e.g., 2-bit of the pixel data at rules 1 to 4 in FIG. 5) of the data block (e.g., any of CU01* to CU04* in FIG. 9) of the one compression unit, from which removed are the coding header (e.g., any of 0-bit to 6-bit) detected by the coding header detecting step (ST1101 to ST1109 in FIG. 16) and the number data of the pixels followed (e.g., any of 2-bit to 8-bit in FIG. 5) detected by the continuous pixel number detecting step (ST1110 to ST1113 in FIG. 16); and a pixel pattern restoration step (e.g., ST1115 to ST1118 in FIG. 16) for arranging bit data of the content determined by the pixel data determining step (ST1114 in FIG. 16), by a number indicated by the number data of the pixels followed (e.g., any of 2-bit to 8-bit in FIG. 5) detected by the continuous pixel number detecting step (ST1110 to ST1113 in FIG. 16), so as to restore a pattern of uncompressed pixel data of the one compression unit.

To achieve the above-mentioned third object, according to a system of the present invention, an information integral body (e.g., PXD in FIG. 9, or SPD in FIG. 10), formed of a plurality of pixel data each defined by a predetermined number of bits (e.g., 2-bit), is processed so that a data block, containing the same continuous pixel data, is compressed (e.g., ST806 in FIG. 13) as one unit of compression (e.g., any of CU01 to CU04 in FIG. 9), and a bit train of the compressed data block is then expanded (e.g., ST1005 in FIG. 15). The system is constituted by a combination of:

(a) an encoding processing including:
a step (e.g., ST806 in FIG. 13) for generating a compressed unit data block (e.g., CU01* to CU04* in FIG. 9) in accordance with a coding header (e.g., 0-bit to 6-bit of rules 1 to 4 in FIG. 5) corresponding to a continuing number (e.g., any of 1 to 255) of the same pixel data in the data block of the one compression unit, with a number of pixels followed (e.g., 2-bit to 8-bit) indicating the continuing number (1–255) of the same pixel data, and with data (e.g., 2-bit) representing the same pixel data in the data block of the one compression unit, and (b) a decoding processing including:
a coding header detecting step (e.g., ST1101 to ST1109 in FIG. 16) for detecting the coding header from the data block (e.g., any of CU01* to CU04* in FIG. 9) of the one compression unit generated by the generating step of the encoding processing, wherein the coding header indicates the number of pixels followed (e.g., 2-bit to 8-bit), or indicates a group of the number of pixels followed (e.g., 2-bit to 8-bit) and the same pixel data (e.g., 2-bit);

a continuous pixel number detecting step (e.g., ST1110 to ST1113 in FIG. 16) for detecting the number data of the pixels followed (e.g., any of 2-bit to 8-bit in FIG. 5) from the data block (e.g., any of CU01* to CU04* in FIG. 9), after the coding header is detected;

a pixel data determining step (e.g., ST1114 in FIG. 16) for determining a content (e.g., any of "00", "01", "10", "11") of the pixel data in an uncompressed data block (e.g., any of CU01 to CU04 in FIG. 9) of the one compression unit, in accordance with a remainder (e.g., 2-bit of the pixel data at rules 1 to 4 in FIG. 5) of the data block (e.g., any of CU01* to CU04* in FIG. 9) of the one compression unit, from which removed are the coding header (e.g., any of 0-bit to 6-bit; the data length of 0-bit of the header will not affect on A later subtraction) detected by the coding header detecting step (ST1101 to ST1109 in FIG. 16) and the number data of the pixels followed (e.g., any of 2-bit to 8-bit in FIG. 5) detected by the continuous pixel number detecting step (ST1110 to ST1113 in FIG. 16); and a pixel pattern restoration step (e.g., ST1115 to ST1118 in FIG. 16) for arranging bit data of the content determined by the pixel data determining step (ST1114 in FIG. 16), by a number indicated by the number data of the pixels followed (e.g., any of 2-bit to 8-bit in FIG. 5) detected by the continuous pixel number detecting step (ST1110 to ST1113 in FIG. 16), so as to restore a pattern of uncompressed pixel data of the one compression unit.

To achieve the above-mentioned fourth object, according to an information recording medium of the present invention, an information integral body (e.g., PXD in FIG. 9, or SPD in FIG. 10), formed of a plurality of pixel data each defined by a predetermined number of bits (e.g., 2-bit), is recorded so that a data block, containing the same continuous pixel data, is compressed as one unit of compression (e.g., any of CU01 to CU04 in FIG. 9). The information recording medium stores a compressed unit data block (e.g., CU01* to CU04* in FIG. 9) which comprises a coding header (e.g., 0-bit to 6-bit of rules 1 to 4 in FIG. 5) corresponding to a continuing number (e.g., any of 1 to 255) of the same pixel data in the data block of the one compression unit, a number of pixels followed (e.g., 2-bit to 8-bit) indicating the continuing number (1–255) of the same pixel data, and data (e.g., 2-bit) representing the same pixel data in the data block of the one compression unit.

To achieve the above-mentioned fifth object, according to an encoding apparatus (such as an integrated circuit device in which the encoding method of the first object is used) of the present invention, an information integral body (e.g., PXD in FIG. 9, or SPD in FIG. 10), formed of a plurality of pixel data each defined by a predetermined number of bits (e.g., 2-bit), is processed so that a data block, containing the same continuous pixel data, is compressed as one unit of compression (e.g., any of CU01 to CU04 in FIG. 9). The encoding apparatus comprises:

a compression data specifying means (e.g., ST801 in FIG. 13) for specifying the data block of the one compression unit (CU01–CU04) of the information integral body (PXD/SPD); and a compression data generating means (e.g., ST806 in FIG. 13, or ST908 to ST914 in FIG. 14) for generating a compressed unit data block (e.g., CU01* to CU04* in FIG. 9) in accordance with a coding header (e.g., 0-bit to 6-bit of rules 1 to 4 in FIG. 5) corresponding to a continuing number (e.g., any of 1 to 255) of the same pixel data in the data block of the one compression unit, with a number of pixels followed (e.g., 2-bit to 8-bit) indicating the continuing number (1–255) of the same pixel data, and with data (e.g., 2-bit) representing the same pixel data in the data block of the one compression unit.

To achieve the above-mentioned sixth object, according to a decoding apparatus (such as an integrated circuit device in which the decoding method of the second object is used) of the present invention, a bit train of one unit of a compressed data block, obtained by compressing the same continuous pixel data as one unit of compression, is expanded (e.g., ST1005 in FIG. 15), wherein the compressed data block corresponds to at least part of an information integral body (e.g., PXD in FIG. 9, or SPD in FIG. 10) formed by a plurality of pixel data each defined by a predetermined number of bits (e.g., 2-bit), and the compressed data block includes a coding header indicating data of a number of pixels followed, which number data corresponds to the number of the same continuous pixel data, or includes a coding header indicating the number data of pixels followed as well as the same continuous pixel data thereof. The decoding apparatus comprises:

a coding header detecting means (e.g., ST1101 to ST1109 in FIG. 16) for detecting the coding header from the data block (e.g., any of CU01* to CU04* in FIG. 9) of the one compression unit contained in the information integral body (PXD/SPD);

a continuous pixel number detecting means (e.g., ST1110 to ST1113 in FIG. 16) for detecting the number data of the pixels followed (e.g., any of 2-bit to 8-bit in FIG. 5), from the data block (e.g., any of CU01* to CU04* in FIG. 9) of the one compression unit, in accordance with a content of the coding header (e.g., data length of any of 0-bit to 6-bit at rules 1 to 4 in FIG. 5) detected by the coding header detecting means (ST1101 to ST1109);

a pixel data determining means (e.g., ST1114 in FIG. 16) for determining a content (e.g., any of "00", "01", "10", "11") of the pixel data in an uncompressed data block (e.g., any of CU01 to CU04 in FIG. 9) of the one compression unit, in accordance with a remainder (e.g., 2-bit of the pixel data at rules 1 to 4 in FIG. 5) of the data block (e.g., any of CU01* to CU04* in FIG. 9) of the one compression unit, from which removed are the coding header (e.g., any of 0-bit to 6-bit) detected by the coding header detecting means (ST1101 to ST1109 in FIG. 16) and the number data of the pixels followed (e.g., any of 2-bit to 8-bit in FIG. 5) detected by the continuous pixel number detecting means (ST1110 to ST1113 in FIG. 16); and a pixel pattern restoration means (e.g., ST1115 to ST1118 in FIG. 16) for arranging bit data of the content determined by the pixel data determining means (ST1114 in FIG. 16), by a number indicated by the number data of the pixels followed (e.g., any of 2-bit to 8-bit in FIG. 5) detected by the continuous pixel number detecting means (ST1110 to ST1113 in FIG. 16), so as to restore a pattern of uncompressed pixel data of the one compression unit.

To achieve the above-mentioned seventh object, according to a recording apparatus of the present invention, an information integral body (e.g., PXD in FIG. 9, or SPD in FIG. 10), formed of a plurality of pixel data each defined by a predetermined number of bits (e.g., 2-bit), is processed so that a data block, containing the same continuous pixel data, is compressed as one unit of compression (e.g., any of CU01 to CU04 in FIG. 9). The recording apparatus comprises:

a compression data generating means (e.g., 200 in FIG. 24; ST806 in FIG. 13, or ST908 to ST914 in FIG. 14) for generating a compressed unit data block (e.g., CU01* to CU04* in FIG. 9) in accordance with a coding header (e.g., 0-bit to 6-bit of rules 1 to 4 in FIG. 5) corresponding to a continuing number (e.g., any of 1 to 255) of the same pixel data in the data block of the one compression unit, with a number of pixels followed (e.g., 2-bit to 8-bit) indicating the continuing number (1–255) of the same pixel data, and with data (e.g., 2-bit) representing the same pixel data in the data block of the one compression unit; and a recording means (e.g., 702 to 704 in FIG. 24) for recording on a prescribed recording medium (e.g., OD in FIG. 24) the compressed unit data block (e.g., CU01* to CU04* in FIG. 9) generated by the compression data generating means (200).

To achieve the above-mentioned eighth object, according to a playing back apparatus of the present invention, a bit train of one unit of a compressed data block, obtained by compressing the same continuous pixel data as one unit of compression, is played back from a recording medium (e.g., OD) and is expanded (e.g., ST1005 in FIG. 15), wherein the compressed data block corresponds to at least part of an information integral body (e.g., PXD in FIG. 9, or SPD in FIG. 10) formed by a plurality of pixel data each defined by a predetermined number of bits (e.g., 2-bit), and the compressed data block includes a coding header indicating data of a number of pixels followed, which number data corresponds to the number of the same continuous pixel data, or includes a coding header indicating the number data of pixels followed as well as the same continuous pixel data thereof. The playing back apparatus comprises:

a coding header detecting means (e.g., ST1101 to ST1109 in FIG. 16) for detecting the coding header from the data block (e.g., any of CU01* to CU04* in FIG. 9) of the one compression unit contained in the information integral body (PXD/SPD);

a continuous pixel number detecting means (e.g., ST1110 to ST1113 in FIG. 16) for detecting the number data of the pixels followed (e.g., any of 2-bit to 8-bit in FIG. 5), from the data block (e.g., any of CU01* to CU04* in FIG. 9) of the one compression unit, in accordance with a content of the coding header (e.g., data length of any of 0-bit to 6-bit at rules 1 to 4 in FIG. 5) detected by the coding header detecting means (ST1101 to ST1109);

a pixel data determining means (e.g., ST1114 in FIG. 16) for determining a content (e.g., any of "00", "01", "10", "11") of the pixel data in an uncompressed data block (e.g., any of CU01 to CU04 in FIG. 9) of the one compression unit, in accordance with a remainder (e.g., 2-bit of the pixel data at rules 1 to 4 in FIG. 5) of the data block (e.g., any of CU01* to CU04* in FIG. 9) of the one compression unit, from which removed are the coding header (e.g., any of 0-bit to 6-bit) detected by the coding header detecting means (ST1101 to ST1109 in FIG. 16) and the number data of the pixels followed (e.g., any of 2-bit to 8-bit in FIG. 5) detected by the continuous pixel number detecting means (ST1110 to ST1113 in FIG. 16); and a pixel pattern restoration means (e.g., ST1115 to ST1118 in FIG. 16) for arranging bit data of the content determined by the pixel data determining means (ST1114 in FIG. 16), by a number indicated by the number data of the pixels followed (e.g., any of 2-bit to 8-bit in FIG. 5) detected by the continuous pixel number detecting means (ST1110 to ST1113 in FIG. 16), so as to restore a pattern of uncompressed pixel data of the one compression unit.

To achieve the above-mentioned ninth object, according to a broadcasting system of the present invention, an information integral body (e.g., PXD in FIG. 9, or SPD in FIG. 10), formed of a plurality of pixel data each defined by a predetermined number of bits (e.g., 2-bit), is processed so that a data block, containing the same continuous pixel data, is compressed as one unit of compression (e.g., any of CU01 to CU04 in FIG. 9). The broadcasting system comprises:

an encoder (e.g., 200 in FIG. 10) for generating a compressed unit data block (e.g., CU01* to CU04* in FIG. 9) in accordance with a coding header (e.g., 0-bit to 6-bit of rules 1 to 4 in FIG. 5) corresponding to a continuing number (e.g., any of 1 to 255) of the same pixel data in the data block of the one compression unit, with a number of pixels followed (e.g., 2-bit to 8-bit) indicating the continuing number (1–255) of the same pixel data, and with data (e.g., 2-bit) representing the same pixel data in the data block of the one compression unit; and a broadcasting means (e.g., 210 to 212 in FIG. 10) for outputting, by means of a radio wave or signal cable, the compressed unit data block (e.g., CU01* to CU04* in FIG. 9) generated by the encoder (200).

Or, the broadcasting system may comprise:

a digital signal generator means (e.g., 300 in FIG. 22) for generating a digital signal of a compressed unit data block (e.g., CU01* to CU04* in FIG. 9) in accordance with a coding header (e.g., 0-bit to 6-bit of rules 1 to 4 in FIG. 5) corresponding to a continuing number (e.g., any of 1 to 255) of the same pixel data in the data block of the one compression unit, with a number of pixels followed (e.g., 2-bit to 8-bit) indicating the continuing number (1–255) of the same pixel data, and with data (e.g., 2-bit) representing the same pixel data in the data block of the one compression unit; and a broadcasting means (e.g., 210 to 212 in FIG. 22) for outputting, by means of a radio wave or signal cable, the digital signal generated by the digital signal generator means (300).

To achieve the above-mentioned tenth object, according to an electric mailing system of the present invention, an information integral body (e.g., PXD in FIG. 9, or SPD in FIG. 10), formed of a plurality of pixel data each defined by a predetermined number of bits (e.g., 2-bit), is processed so that a data block, containing the same continuous pixel data, is compressed as one unit of compression (e.g., any of CU01 to CU04 in FIG. 9). The electric mailing system comprises:

a compressed data generating means (e.g., 5001 to 5031 in FIG. 23) for generating a compressed unit data block (e.g., CU01* to CU04* in FIG. 9) in accordance with a coding header (e.g., 0-bit to 6-bit of rules 1 to 4 in FIG. 5) corresponding to a continuing number (e.g., any of 1 to 255) of the same pixel data in the data block of the one compression unit, with a number of pixels followed (e.g., 2-bit to 8-bit) indicating the continuing number (1–255) of the same pixel data, and with data (e.g., 2-bit) representing the same pixel data in the data block of the one compression unit;

a transmitter means (e.g., 5031, 600 in FIG. 23) for transmitting a signal containing the compressed unit data block (CU01* to CU04* in FIG. 9) generated by the compressed data generating means (5001 to 5031 in FIG. 23);

a receiver means (e.g., 503N in FIG. 23) for receiving the signal transmitted by the transmitter means (5031, 600 in FIG. 23); and a data restoration means (e.g., 501N to 503N in FIG. 23) for detecting the coding header from the compressed unit data block (CU01* to CU04*) received by the receiver means (503N), for detecting a location of the continuous pixel data in accordance with a content of the detected coding header, for obtaining from the detected location the continuous pixel data as well as the pixel data subsequent to the continuous pixel data, and for restoring an uncompressed pixel data block of the one compression unit representing data which is not subjected to a data compression by the compressed data generating means (e.g., 5001 to 5031 in FIG. 23).

According to the encoding method of the present invention, three or more types of pixel data are compressed on the basis of at least rules 2 to 4 of the following rules 1 to 6. Assume that pixel data indicating respective pixel dots consists of 2 bits.

Rule 1
For Continuous 1 To 3 Identical Pixel Data
One data unit consists of 4 bits. The first 2 bits represent the number of pixels followed. The next 2 bits represent pixel data (image compressed data PXD).
Example
If the number of pixels followed (e.g., "11") is one, then PXD=01.11.
If the number of pixels followed (e.g., "10") is two, then PXD=10.10.
If the number of pixels followed (e.g., "00") is three, then PXD=11.00.

Rule 2
For Continuous 4 To 15 Identical Pixel Data
One data unit consists of 8 bits. The first 2 bits are set to "00". The subsequent 4 bits represent the number of pixels followed. The next 2 bits represent pixel data.
Example
If the number of pixels followed (e.g., "01") is five, then PXD=00.0101.01.

Rule 3
For Continuous 16 To 63 Identical Pixel Data
One data unit consists of 12 bits. The first 4 bits are set to "0000". The subsequent 6 bits represent the number of pixels followed. The next 2 bits represent pixel data.

Example
If the number of pixels followed (e.g., "10") is 16, then PXD=0000.010000.10.
If the number of pixels followed (e.g., "11") is 46, then PXD=0000.101110.11.

Rule 4
For Continuous 64 To 255 Identical Pixel Data
One data unit consists of 16 bits. The first 6 bits are set to "000000". The subsequent 8 bits represent the number of pixels followed. The next 2 bits represent pixel data.
Example
If the number of pixels followed (e.g., "01") is 255, then PXD=000000.11111111.01.

Rule 5
For Continuous Identical Pixel Data Up To The End Of Line Of Pixel Data String To Be Run-Length Coded
One data unit consists of 16 bits. The first 14 bits are set to "00000000000000". The next 2 bits represent pixel data.
Example
If identical pixels (e.g., "00") continues to the end of a line, then PXD=00000000000000.00.
If identical pixels (e.g., "11") continues to the end of a line, then PXD=00000000000000.11.

Rule 6
For Non-Byte-Aligned State At The End Of Line
Four-bit dummy data "0000" is added to the end of a line.
Example
[0/1 data string=(integer multiple of 8)–4 bits].0000

According to the decoding method of the present invention, an original data before encoded is retrieved by a reverse operation of the above encoding rules.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out in the appended claims.

BRIEF DESCRIPTION OF THE DRAWINGS

The accompanying drawings, which are incorporated in and constitute a part of the specification, illustrate presently preferred embodiments of the invention and, together with the general description given above and the detailed description of the preferred embodiments given below, serve to explain the principles of the invention.

FIG. 4 is a view showing the contents of a sub-picture data, of the sub-picture pack in FIG. 3, to which an encoding method according to an embodiment of the present invention is applied;

FIG. 5 is a view for explaining compression rules 1 to 6 used in an encoding method according to an embodiment of the present invention in a case wherein image data constituting the sub-picture data portion in FIG. 4 consists of a plurality of bits (2 bits in this case);

FIG. 6 is a view for explaining compression rules 11 to 15 used in an encoding method according to another embodiment of the present invention in a case wherein image data constituting the sub-picture data portion in FIG. 4 consists of 1 bit;

FIG. 7 is a view for explaining a detailed example of how the pixel data of each line is encoded (run-length compressed) in a case wherein pixel data constituting the sub-picture data portion in FIG. 4 consists of, e.g., first to ninth lines, 2-bit pixels (a maximum of four types) are arranged on each line, and character patterns "A" and "B" are expressed by the 2-bit pixels on the respective lines;

FIG. 8 is a view for explaining two examples (non-interlaced display and interlaced display) of how the character pattern "A" of the pixel data (sub-picture data) encoded as shown in FIG. 7 is decoded;

DETAILED DESCRIPTION OF THE PREFERRED EMBODIMENTS

Figure 1A:
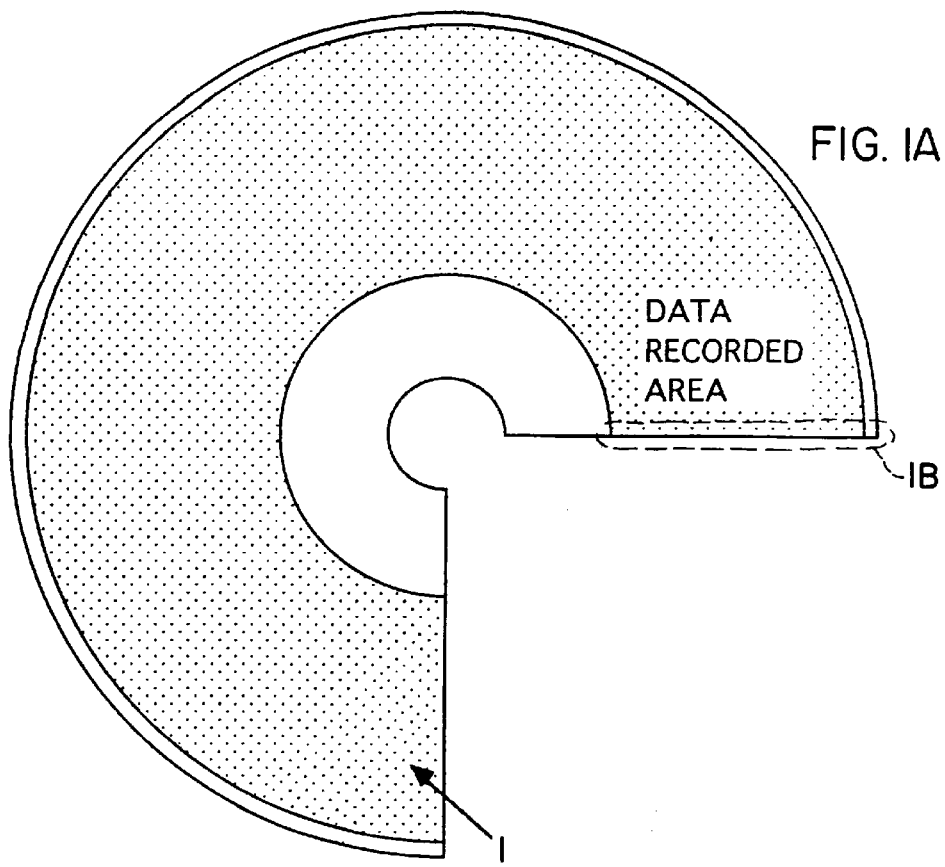
FIG. 1 is a view showing the structure of data recorded on an optical disk as an information holding medium to which the present invention can be applied.

Encoding and decoding methods according to an embodiment of the present invention will be described below with reference to the accompanying drawings. In order to avoid a repetitive description, the same reference numerals denote parts having the same functions throughout the drawings.

FIGS. 1 to 27 are views for explaining an image information encoding/decoding system according to an embodiment of the present invention.

Figure 1B:
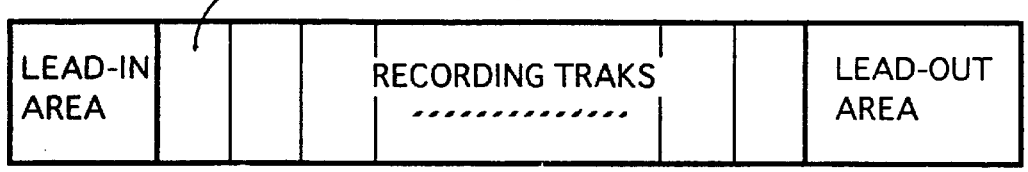
Figure 1C:
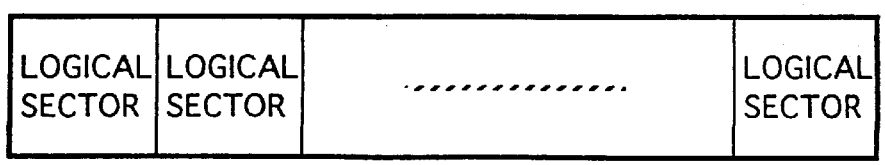

FIG. 1 schematically shows the structure of data recorded on double-sided optical disk OD as an information holding medium to which the present invention can be applied.

Optical disk OD is a double-sided optical disk. Each surface of this optical disk has a storage capacity of about 5 Gbytes. Many recording tracks are arranged between the lead-in area on the inner peripheral side of the disk and the lead-out area on the outer peripheral side of the disk. Each track is constituted by many logical sectors. Various pieces of information (compressed digital data) are stored in the respective sectors.

Figure 2A:
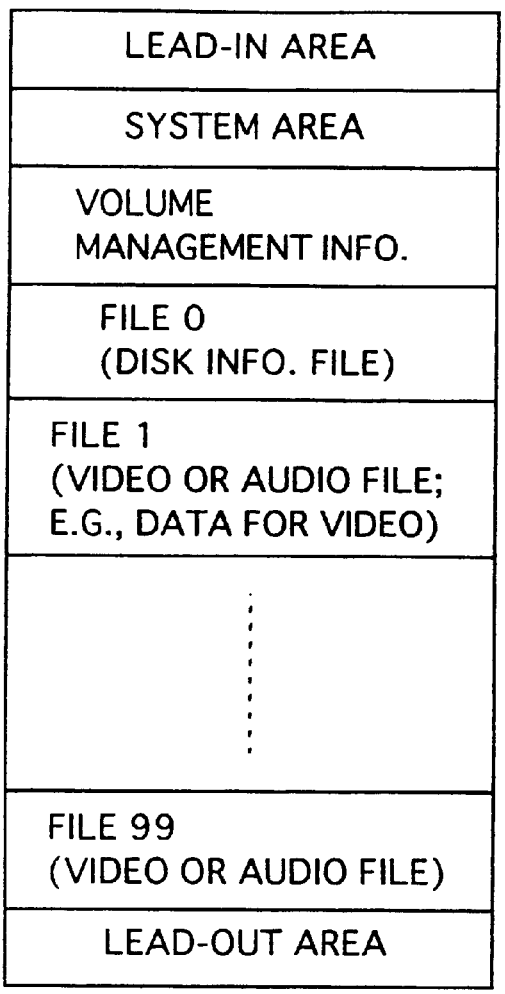
FIG. 2 is a view showing the logical structure of data to be recorded on the optical disk in FIG. 1.
Figure 2B:
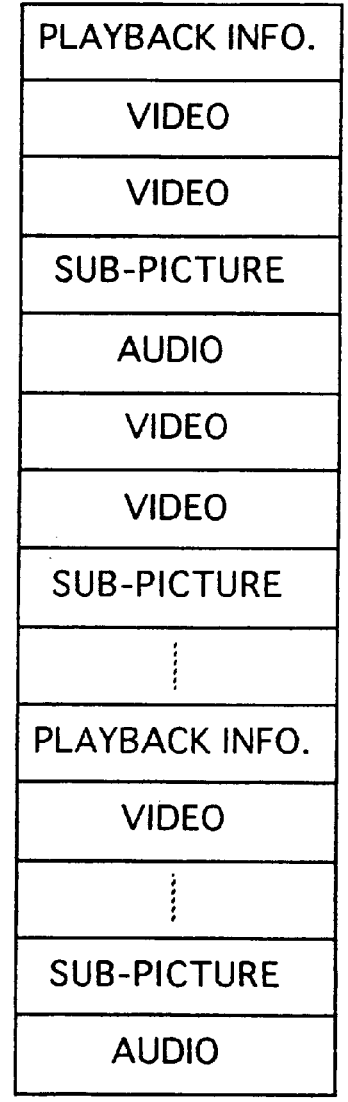

FIG. 2 shows the logical structure of data to be recorded on the optical disk in FIG. 1. More specifically, a system area in which system data used by disk OD is stored, a volume management information area, and a plurality of file areas are formed in the aggregate of logical sectors in FIG. 1.

Of the plurality of file areas, for example, file 1 contains main picture information ("VIDEO" in FIG. 2), sub-picture information ("SUB-PICTURE" in FIG. 2) having contents supplementary to the main picture information, audio information ("AUDIO" in FIG. 2), playback information ("PLAYBACK INFO." in FIG. 2), and the like.

Figure 3:
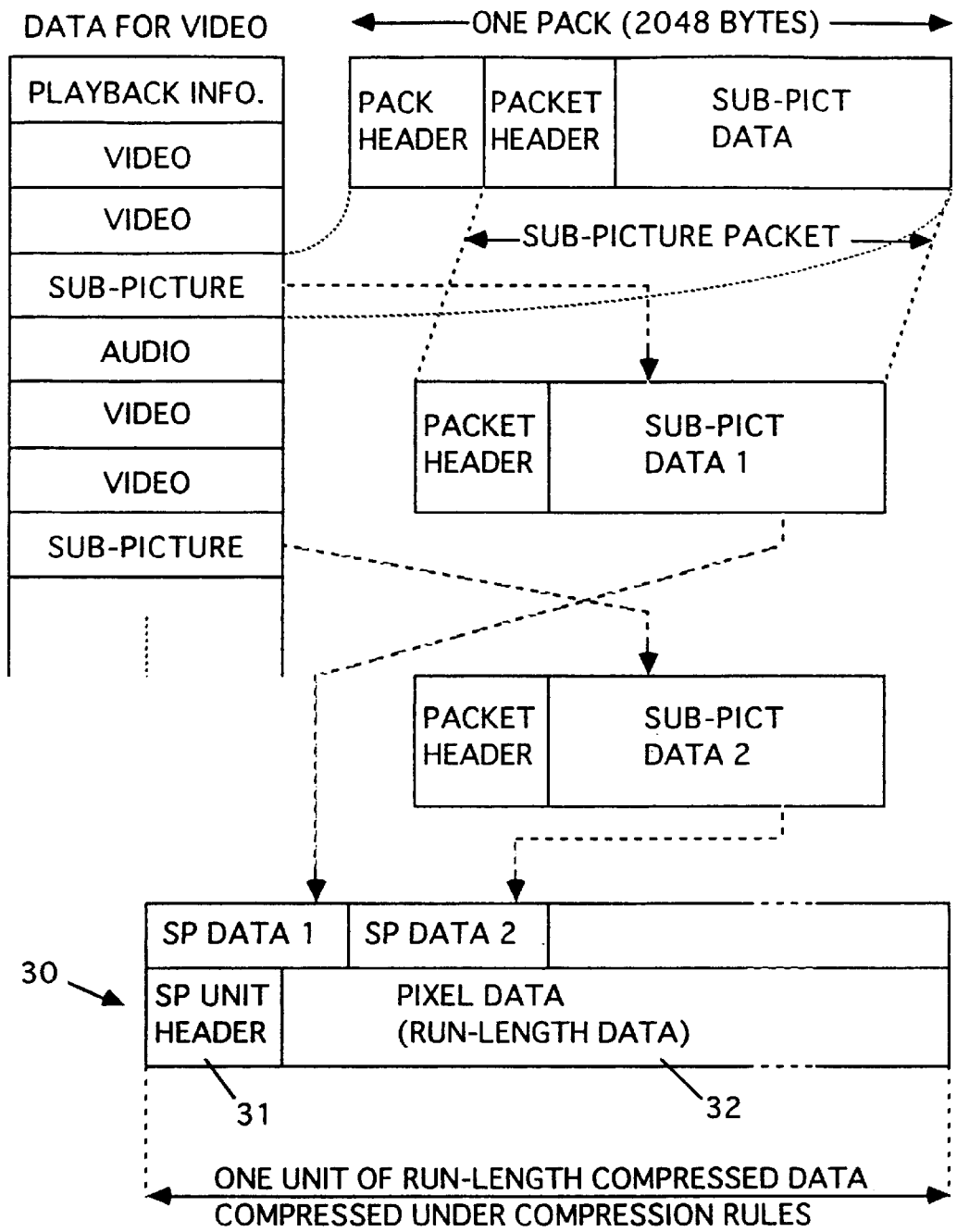
FIG. 3 is a view showing the logical structure of a sub-picture pack to be encoded (run-length compressed), of the data structure shown in FIG. 2.

FIG. 3 shows an example of the logical structure of a sub-picture information pack being subjected to the encoding (or the run-length compression).

As shown at the upper portion of FIG. 3, one pack of the sub-picture information contained in the video data is constituted by, for example, 2048 bytes. This one pack sub-picture information includes one or more sub-picture packets subsequent to the header of the leading pack. The first sub-picture packet is provided with run-length-compressed sub-picture data (SP DATA1) after its packet header. Similarly, the second sub-picture packet is provided with run-length-compressed sub-picture data (SP DATA2) after its packet header.

Sub-picture unit header 31 is assigned to sub-picture data unit 30 which is obtained by gathering a plurality of sub-picture data pieces (SP DATA1, SP DATA2, . . . ). Here, the gathered sub-picture data pieces constitute one unit of the run-length compression. Following after sub-picture unit header 31 is pixel data 32 obtained by run-length-compressing the picture data of one unit which is, for example, image data on one horizontal (scanning) line of a two-dimensional display screen.

In other words, one unit of run-length-compressed data 30 is formed of a group of the sub-picture data pieces (SP DATA1, SP DATA2, . . . ) of one or more sub-picture packets. In short, sub-picture data unit 30 is constituted by sub-picture unit header 31, in which various parameters for sub-picture displaying are recorded, and display data (compressed pixel data) 32 formed of run-length codes.

FIG. 4 shows the contents of sub-picture unit header 31 in one unit of run-length compressed data 30 in FIG. 3. The data of a sub-picture (e.g., subtitles corresponding to a scene in a movie) to be recorded/transmitted (communicated) together with a main picture (e.g., a picture of the movie) will be described below.

As will be seen from FIG. 4, recorded in sub-picture unit header 31 are: start address SPDDADR of sub-picture pixel data (display data); end address SPEDADR of pixel data 32; data SPDSIZE of the display-start position and display area (width and height) of pixel data 32 with respect to a TV display screen; background color SPCHI designated by the system; sub-picture color SPCINFO designated by the system; pallet color number SPADJINFO of an emphasizing color designated by the system; modification information SPMOD of sub-picture pixel data 32; mixing ratio SPCONT of sub-picture (SP) to main-picture (MP); start-timing (corresponding to the frame number of MP) SPDST of the sub-picture; and start addresses SPLine1 to SPLineN of decode data of respective lines.

More specifically, as indicated by the lower portion in FIG. 4, various parameters (e.g., SPDDADR) having the following contents are recorded on sub-picture unit header 31:

(1) the start address information (SPDDADR: an address relative to the beginning of the header) of the display data (sub-picture pixel data) following the header;

(2) the end address information (SPEDADR: an address relative to the beginning of the header) of the display data;

(3) information (SPDSIZE) indicating the display start position and display range (width and height) of the display data on the monitor screen;

(4) information (SPCHI) designated by the system and indicating the background color (a 16-color palette number set by a story information table or a display control sequence table);

(5) information designated by the system and indicating a sub-picture color (a 16-color palette number set by the story information table or the display control sequence table);

(6) information (SPAJDNFO) designated by the system and indicating a sub-picture emphasizing color (a color palette number set by the story information table or the display control sequence table);

(7) information (SPMOD) designated by the system and specifying the sub-picture image mode information indicating either a field mode for non-interlaced display or a frame mode for interlaced display (when the pixel data to be compressed is defined by various number of bits, the number of bits of this pixel data can be specified by the content of this mode information);

(8) information (SPCONT) designated by the system and indicating the mixing ratio of the sub-picture to the main picture;

(9) information (SPDST) indicating the display start timing of the sub-picture with the frame number (e.g., an I picture frame number of MPEG) of the main picture;

(10) information (SPlinl) indicating the start address (an address relative to the beginning of the sub-picture unit header) of the encoded data on the first line of the sub-picture; and

(11) information (SPlinN) indicating the start address (an address relative to the beginning of the sub-picture unit header) of the encoded data on the Nth line of he sub-picture.

Note that information SPCONT indicating the mixing ration of the sub-picture to the main picture indicates the mixing ratio of the sub-picture with (system set value)/255, and the mixing ratio of the main picture with (255—set value)/255.

Sub-picture unit header 31 includes the start address (SPLine 1 to SPLine N) of data to be decoded on every lines. For this reason, scrolling of only the sub-picture on the display screen can be realized by changing the designation of a decoding start line in accordance with an instruction from a microcomputer (MPU or CPU) on the decoding side. (How the scrolling is performed will be described later with reference to FIG. 21)

A field/frame mode (SPMOD) can be recorded on sub-picture unit header 31 to indicate how the sub-picture corresponds to a TV field/frame of the NTSC scheme.

In general, bit "0" is written in this field/frame mode recording portion (SPMOD). Upon reception of sub-picture data unit 30, the decoding side determines from bit "0" that the frame mode (non-interlaced mode) is set, and decodes the received encoded data in units of lines. As a result, a decoded image like the one shown at the lower left position in FIG. 8 is output from the decoder. This image is displayed on the display screen of a monitor, a television (TV) set, or the like.

If bit "1" is written in the field/frame mode recording portion (SPMOD), the decoding side determines that the field mode (interlaced mode) is set. In this case, after the encoded data is decoded in units of lines, the same data corresponding to two lines are consecutively output, as shown at the lower right position in FIG. 8. As a result, a frame corresponding to the TV interlaced mode can be obtained. With this operation, an image twice as large in amount as that in the frame mode (non-interlaced mode) can be displayed with the same data amount, although the image quality is lower than that in the frame mode.

The data length (variable length) of the pixel data (run-length data) 32 of sub-picture shown in FIG. 3 or 4 is determined depending on whether run-length compression rules 1 to 6 in FIG. 5 or run-length compression rules 11 to 15 in FIG. 6 are used.

Rules 1 to 6 in FIG. 5 are used when pixel data to be compressed has a multi-bit configuration (2 bits in this case). Rules 11 to 15 in FIG. 6 are used when pixel data to be compressed has a 1-bit configuration.

Whether run-length compression rules 1 to 6 or 11 to 15 are to be used can be determined by the contents (e.g., a bit width flag) of parameter SPMOD (see a portion near the middle of the table shown at the lower portion in FIG. 4) in sub-picture unit header 31. If, for example, the bit width flag of parameter SPMOD is "1", the pixel data to be run-length compressed is 2-bit data, and hence rules 1 to 6 in FIG. 5 are used. If the bit width flag of parameter SPMOD is "0", the pixel data to be run-length compressed is 1-bit data, and hence rules 11 to 15 in FIG. 6 are used.

Assume that four groups A, B, C, and D of compression rules are provided respectively for four kinds of the bit-configuration of pixel data, when this pixel data can optionally have the bit-configuration of either of 1-bit, 2-bit, 3-bit, and 4-bit. Under this assumption, when parameter SPMOD is constituted by 2-bit flag, the 1-bit pixel data using rule group A can be designated by the 2-bit flag of "00". In similar manner, the 2-bit pixel data using rule group B can be designated by the 2-bit flag of "01", the 3-bit pixel data using rule group C can be designated by the 2-bit flag of "10", and the 4-bit pixel data using rule group D can be designated by the 2-bit flag of "11". In this case, rules 11 to 15 of FIG. 6 can be used for the compression rules of group A, and rules 1 to 6 of FIG. 5 can be used for the compression rules of group B. When the contents of coding headers and the bit-configuration of pixel data, as well as the number of rules, are properly modified, the compression rules of groups C and D will be derived from rules 1 to 6 of FIG. 5.

FIG. 5 is a view for explaining run-length compression rules 1 to 6 which are used in an encoding method according to an embodiment of the present invention, wherein pixel data constituting sub-picture pixel data (run-length data) 32 in FIG. 4 consists of a plurality of bits (2 bits in this case).

Figure 9A:
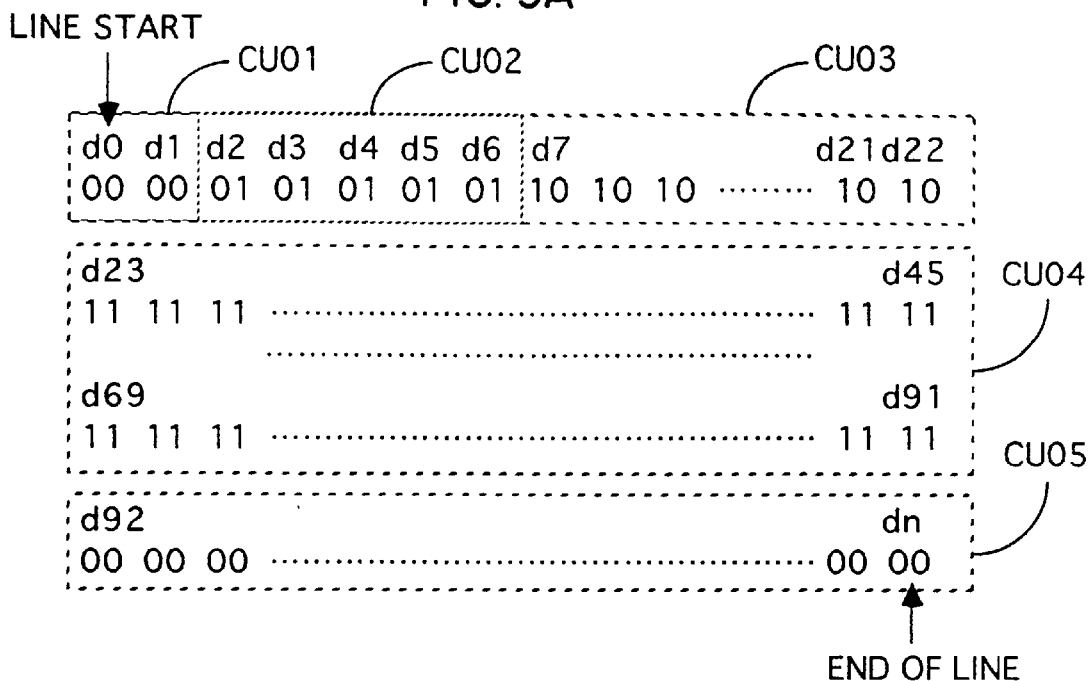
FIG. 9 is a view for explaining compression rules 1 to 6, in detail, which are used in an encoding method according to an embodiment of the present invention in a case wherein image data constituting the sub-picture data in FIG. 4 consists of 2 bits.
Figure 9B:
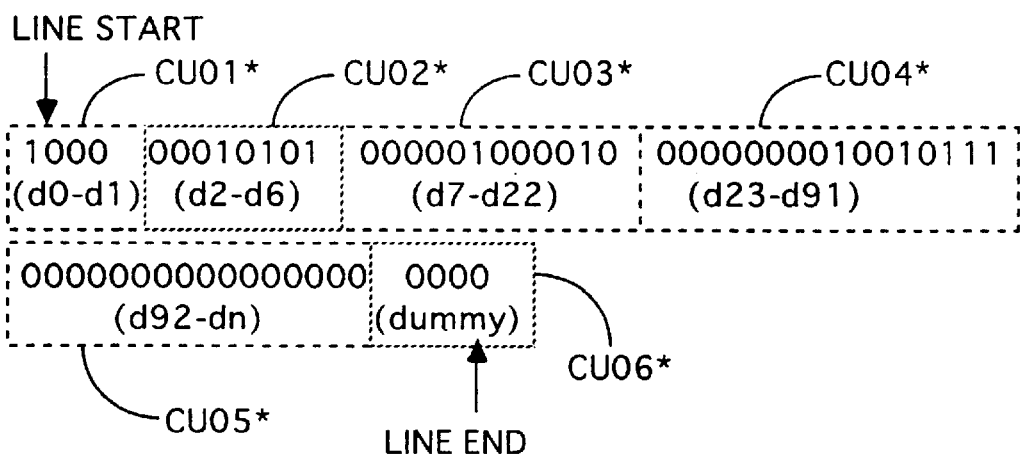

FIG. 9 is a view for explaining compression rules 1 to 6, in detail, in a case wherein pixel data constituting sub-picture pixel data (run-length data) 32 in FIG. 4 consists of 2 bits.

According to rule 1 on the first row in FIG. 5, when 1 to 3 identical pixels continue, one encoded (run-length compressed) data unit is constituted by 4 bits. In this case, the first 2 bits represent the number of pixels followed, and the next 2 bits represent pixel data (pixel color information or the like).

For example, first compression data unit CU01 of picture data PXD before compressed, which is indicated by the upper portion in FIG. 9, contains 2 2-bit pixel data d0, d1=(0000)b (b indicates binary data). In this case, 2 identical 2-bit pixel data (00)b continue.

In this case, as indicated by the lower portion in FIG. 9, 2-bit display (10)b representing the number of pixels followed "2" is coupled to contents (00)b of the pixel data to form d0, d1=(1000)b, which is data unit CU01* of picture data PXD after compressed.

In other words, (0000)b of data unit CU01 is converted into (10000)b of data unit CU01* according to rule 1. In this case, bit length compression is not practically realized. However, for example, 3 continuous identical pixels (00)b, i.e., CU01=(000000)b, are compressed into CU01*=(1100) b. That is, the pixel data can be compressed by 2 bits.

According to rule 2 on the second row in FIG. 5, when 4 to 15 identical pixels continue, one encoded data unit is constituted by 8 bits. In this case, the first 2 bits represent a coding header indicating that encoding is performed according to rule 2, the subsequent 4 bits represent the number of pixels followed, and the next 2 bits represent pixel data.

For example, second compression data unit CU02 of picture data PXD before compressed, which is indicated by the upper portion in FIG. 9, contains 5 2-bit pixel data d2, d3, d4, d5, d6=(0101010101)b. In this case, 5 identical 2-bit pixel data (01)b continue.

In this case, as indicated by the lower portion in FIG. 9, coding header (00)b, 4-bit display (0101)b representing the number of pixels followed "5", and contents (01)b of the pixel data are coupled to each other to form d2, d6= (00010101)b, which is data unit CU02* of picture data PXD after compressed.

In other words, (0101010101)b (10-bit length) of data unit CU02 is converted into (00010101)b (8-bit length) of data unit CU02* according to rule 2. In this case, the 10-bit data is compressed into the 8-bit data, i.e., the substantial bit length compression amount corresponds to only 2 bits. If, however, the number of pixels followed is 15 (which corresponds to a 30-bit length because 15 "01"s of CU02 continue), the data is compressed into 8-bit data (CU02*= 00111101). That is, 30-bit data can be compressed by 22 bits. The bit compressing effect based on rule 2 is therefore larger than that based on rule 1. In order to cope with run-length compression of a fine image with high resolution, rule 1 is also required.

According to rule 3 on the third row in FIG. 5, when 16 to 63 identical pixels continue, one encoded data unit is constituted by 12 bits. In this case, the first 4 bits represent a coding header indicating that encoding is performed according to rule 3, the subsequent 6 bits represent the number of pixels followed, and the next 2 bits represent pixel data.

For example, third compression data unit CU03 of picture data PXD before compressed, which is indicated by the upper portion in FIG. 9, contains 16 2-bit pixel data d7 to d22=(101010 . . . 1010)b. In this case, 16 identical 2-bit pixel data (10)b continue.

In this case, as indicated by the lower portion in FIG. 9, coding header (0000)b, 6-bit display (010000)b representing the number of pixels followed "16", and contents (10)b of the pixel data are coupled to each other to form d7 to d22=(000001000010)b, which is data unit CU03* of picture data PXD after compressed.

In other words, (101010 . . . 1010)b (32-bit length) of data unit CU03 is converted into (000001000010)b (12-bit length) of data unit CU03* according to rule 3. In this case, the 32-bit data is compressed into the 12-bit data, i.e., the substantial bit length compression amount corresponds to 20 bits. If, however, the number of pixels followed is 63 (which corresponds to a 126-bit length because 63 "10"s of CU03 continue), the data is compressed into 12-bit data (CU03*= 000011111110). That is, 126-bit data can be compressed by 114 bits. The bit compressing effect based on rule 3 is therefore larger than that based on rule 2.

According to rule 4 on the fourth row in FIG. 5, when 64 to 255 identical pixels continue, one encoded data unit is constituted by 16 bits. In this case, the first 6 bits represent a coding header indicating that encoding is performed according to rule 4, the subsequent 8 bits represent the number of pixels followed, and the next 2 bits represent pixel data.

For example, fourth compression data unit CU04 of picture data PXD before compressed, which is indicated by the upper portion in FIG. 9, contains 69 2-bit pixel data d23 to d91=(111111 . . . 1111)b. In this case, 69 identical 2-bit pixel data (11)b continue.

In this case, as indicated by the lower portion in FIG. 9, coding header (00000)b, 8-bit display (00100101)b representing the number of pixels followed "69", and contents (11)b of the pixel data are coupled to each other to form d23 to d91=(0000000010010111)b, which is data unit CU04* of picture data PXD after compressed.

In other words, (111111 . . . 1111)b (138-bit length) of data unit CU04 is converted into (0000000010010111)b (16-bit length) of data unit CU04* according to rule 4. In this case, the 138-bit data is compressed into the 16-bit data, i.e., the substantial bit length compression amount corresponds to 122 bits. If, however, the number of pixels followed is 255 (which corresponds to a 510-bit length because 255 "11"s of CU04 continue), the data is compressed into 16-bit data (CU04*=0000001111111111). That is, 510-bit data can be compressed by 494 bits. The bit compressing effect based on rule 4 is therefore larger than that based on rule 3.

According to rule 5 on the fifth row in FIG. 5, when identical pixels continue from a switching point of a data unit of encoding to the end of a line, one encoded data unit is constituted by 16 bits. In this case, the first 14 bits represent a coding header indicating that encoding is performed according to rule 5, and the next 2 bits represent pixel data.

For example, fourth compression data unit CU05 of picture data PXD before compressed, which is indicated by the upper portion in FIG. 9, contains one or more 2-bit pixel data d92 to dn=(000000 . . . 0000)b. In this case, a finite number of identical 2-bit pixel data (00)b continue. According to rule 5, however, the number of pixels followed may be 1 or more.

In this case, as indicated by the lower portion in FIG. 9, coding header (00000000000000)b is coupled contents (00)b of the pixel data to form d92 to dn= (0000000000000000)b, which is data unit CU05* of picture data PXD after compressed.

In other words, (000000 . . . 0000)b (unspecified bit length) of data unit CU05 is converted into (0000000000000000)b (16-bit length) of data unit CU05* according to rule 5. According to rule 5, if the number of pixels followed up to the end of a line is 16 or more, a compressing effect can be obtained.

According to rule 6 on the sixth row in FIG. 5, if the length of 1-line compressed data PXD is not an integer multiple of 8 bits (i.e., not byte-aligned) at the end of a pixel line on which data to be encoded are arranged, 4-bit dummy data is added to the 1-line compressed data to make 1-line compressed data PXD coincide with a byte unit (i.e., for byte-aligning).

For example, the total bit length of data units CU01* to CU05* of picture data PXD after compressed, which is indicated by the lower portion in FIG. 9, is always an integer multiple of 4 bits. However, this length is not always an integer multiple of 8 bits.

If, for example, the total bit length of data units CU01* to CU05* is 1020, and 4 bits are required for byte-aligning, 4-bit dummy data CU06*=(0000)b is added to the end of the 1020-bit data to output data units CU01* to CU06* as byte-aligned 1024-bit data.

Note that 2-bit pixel data is not limited to data representing four types of pixel colors. For example, pixel data (00)b may represent a background pixel of a sub-picture; pixel data (01)b, a pattern pixel of the sub-picture; pixel data (10)b, the first emphasizing pixel of the sub-picture, and pixel data (11)b, the second emphasizing pixel of the sub-picture.

As the number of bits constituting pixel data becomes larger, more types of sub-picture pixels can be designated. If, for example, pixel data is constituted by 3-bit data (000)b to (111)b, a maximum of eight types of pixel colors+pixel types (emphasizing effects) can be designated in sub-picture data to be run-length encoded/decoded.

FIG. 6 is a view for explaining run-length compression rules 11 to 15 which are used in an encoding method according to another embodiment of the present invention wherein pixel data constituting sub-picture pixel data (run-length data) 32 in FIG. 4 consists of one bit.

According to rule 11 on the first row in FIG. 6, when 1 to 7 identical pixels continue, one encoded (run-length compressed) data unit is constituted by 4 bits. In this case, the first 3 bits represent the number of pixels followed, and the next 1 bit represents pixel data (information such as a pixel type). If, for example, 1-bit pixel data "0", it indicates a background pixel of a sub-picture. If this data is "1", it indicates a pattern pixel of the sub-picture.

According to rule 12 on the second row in FIG. 6, when 8 to 15 identical pixels continue, one encoded data unit is constituted by 8 bits. In this case, the first 3 bits represent a coding header (e.g., 0000) indicating that encoding is based on rule 12, the subsequent 4 bits represent the number of pixels followed, and the next 1 bit represents pixel data.

According to rule 13 on the third row in FIG. 6, when 16 to 127 identical pixels continue, one encoded data unit is constituted by 12 bits. In this case, the first 4 bits represent a coding header (e.g., 0000) indicating that encoding is based on rule 13, the subsequent 7 bits represent the number of pixels followed, and the next 1 bit represents pixel data.

According to rule 14 on the fourth row in FIG. 6, when identical pixels continue from a switching point of a data unit of encoding to the end of a line, one encoded data unit is constituted by 8 bits. In this case, the first 7 bits represent a coding header (e.g., 0000000) indicating that encoding is performed according to rule 14, and the next 1 bit represents pixel data.

According to rule 15 on the sixth row in FIG. 6, if the length of 1-line compressed data PXD is not an integer multiple of 8 bits (i.e., not byte-aligned) at the end of a pixel line on which data to be encoded are arranged, 4-bit dummy data is added to the 1-line compressed data to make 1-line compressed data PXD coincide with a byte unit (i.e., for byte-aligning).

An image encoding method (an encoding method using run-length coding) will be described in detail next with reference to FIG. 7.

FIG. 7 shows a case wherein pixel data constituting sub-picture pixel data (run-length data) 32 in FIG. 4 is constituted by the first to ninth lines, 2-bit pixels (having a maximum of four types of contents) are arranged on each line, and character patterns "A" and "B" are expressed by the 2-bit pixels on the respective lines. The manner of encoding (run-length compressing) the pixel data on each line will be described in detail below.

As indicated by the upper portion in FIG. 7, an image as a source is constituted by three types (a maximum of four types) of pixel data. That is, 2-bit image data (00)b represents the pixel color of the background of the sub-picture; 2-bit image data (01)b, the pixel color of characters "A" and "B" in the sub-picture; and 2-bit image data (10)b, an emphasizing pixel color with respect to sub-picture characters "A" and "B".

When the original image containing characters "A" and "B" is scanned by a scanner or the like, these character patterns are read, from the left to right of each scanning line, in units of pixels. The picture data read in this manner is input to an encoder (denoted by reference numeral 200 in the embodiment in FIG. 10 which will be described later) for performing run-length compression based on the present invention.

This encoder can be constituted by a microcomputer (MPU or CPU) in which software for executing run-length compression based on rules 1 to 6 described with reference to FIG. 5 runs. This encoder software will be described later with reference to the flow charts in FIGS. 13 and 14.

Encoding processing of run-length compressing a sequential bit string of character pattern "A" and "B" read in units of pixels will be described below.

In the case shown in FIG. 7, a source image is assumed to have three color pixels. More specifically, in picture data (the sequential bit string of character patterns "A" and "B") to be encoded, background color pixel "●" is represented by 2-bit pixel data (00)b, character color pixel "#" is represented by 2-bit pixel data (01)b, and emphasizing color pixel "○" is represented by 2-bit pixel data (10)b. The bit count (=2) of pixel data (e.g., 00 or 01) is also called a pixel width.

For the sake of simplicity, in the case shown in FIG. 7, the display width of picture data (sub-picture data) to be encoded is set to be 16 pixels, and the number of scanning lines (display height) is set to be 9 lines.

Image data (sub-picture data) obtained from a scanner is temporarily converted into a run-length value by the microcomputer.

Consider the first line at the lower portion in FIG. 7. Three continuous pixels "● ● ●" are converted into (●*3); subsequent 1 pixel "○", (○*1); subsequent 1 pixel "#", (#*1); subsequent 1 pixel "○", (○*1); subsequent continuous 3 pixels "● ● ●", (●*3); subsequent 1 pixel "○", (○*1); subsequent continuous 4 pixels "####", (#*4); subsequent 1 pixel "○", (!{*1); and last 1 pixel "●", (●*1).

As a result, as indicated by the intermediate portion in FIG. 7, the run-length data (before compressed) on the first line becomes "●*3/○*1/#*1/○*1/●*3/○*1/#*4/○*1/●*1". This data is constituted by a combination of image information such as a character color pixel, and the number of pixels followed which represents a continuation count.

Similarly, the pixel data strings on the second to ninth lines indicated by the upper portion in FIG. 7 become the run-length data strings on the second to ninth lines indicated by the intermediate portion in FIG. 7.

Consider the data on the first line. Since 3 background color pixels "● ● ●" continue from the start of the line, compression rule 1 in FIG. 5 is used. As a result, first three pixels "● ● ●", i.e., (●*3), on the first line are encoded into (1100), which is a combination of 2 bits (11) representing "3" and (00) representing background color pixel "●".

Since the next data on the first line is 1 pixel "○" rule 1 is used. As a result, next pixel "○", i.e., (○*1), on the first line is encoded into (0110), which is a combination of 2 bits (01) representing "1" and (10) representing emphasizing color pixel " ".

Since the next data is 1 pixel "#", rule 1 is used. As a result, next pixel "#", i.e., (#*1), on the first line is encoded into (0101), which is a combination of 2 bits (01) representing "1" and (01) representing character color pixel "#" (the portions corresponding to pixels "# # # . . . " are enclosed with the broken lines in the intermediate and lower portions in FIG. 7).

Similarly, (○*1) is encoded into (0110); (●*3), (1100); and (○*1), (0110).

Since the subsequent data on the first line are 4 pixels "####", compression rule 2 in FIG. 5 is used. As a result, pixels "####", i.e., (#*4), on the first line are encoded into (00010001), which is a combination of 2-bit header (00) representing that rule 2 is used, 4 bits (0100) representing the number of pixels followed "4", and (01) representing character color pixel "#" (the portions corresponding to "#" are enclosed with the broken lines in FIG. 7).

Since the subsequent data on the first line is 1 pixel "○", rule 1 is used. As a result, pixel "○", i.e., (○*1), is encoded into (0110), which is a combination of 2 bits (01) representing "1" and (10) representing emphasizing color pixel "○".

Since the last data on the first line is 1 "●", rule 1 is used. As a result, pixel "●", i.e., (●*1), is encoded into (0100), which is a combination of 2 bits (01) representing "1" and (00) representing background color pixel "●".

In the above manner, run-length data "●*3/○*1/#*1/○*1/●*3/○*1/#*4/○*1/●*1" (before compressed) on the first line is run-length compressed into (1100) (0110) (0101) (0110) (1100) (0110) (00010001) (0110) (0100), thereby completing the encoding of the first line.

In the same manner as described above, encoding proceeds up to the eighth line. All the data on the ninth line are identical background color pixels "● ● ● . . . ". In this case, compression rule 5 in FIG. 5 is used. As a result, run-length data "●*16" (before compressed) on the ninth line is encoded into 16-bit data (0000000000000000), which is a combination of 14-bit header (00000000000000) representing that identical background color pixels "● ● ● . . . " continue to the end of the line and 2-bit pixel data (00) representing background color pixel "●".

Note that encoding based on rule 5 is used when data to be compressed starts midway along a line and continues to the end of the line.

Figure 10:
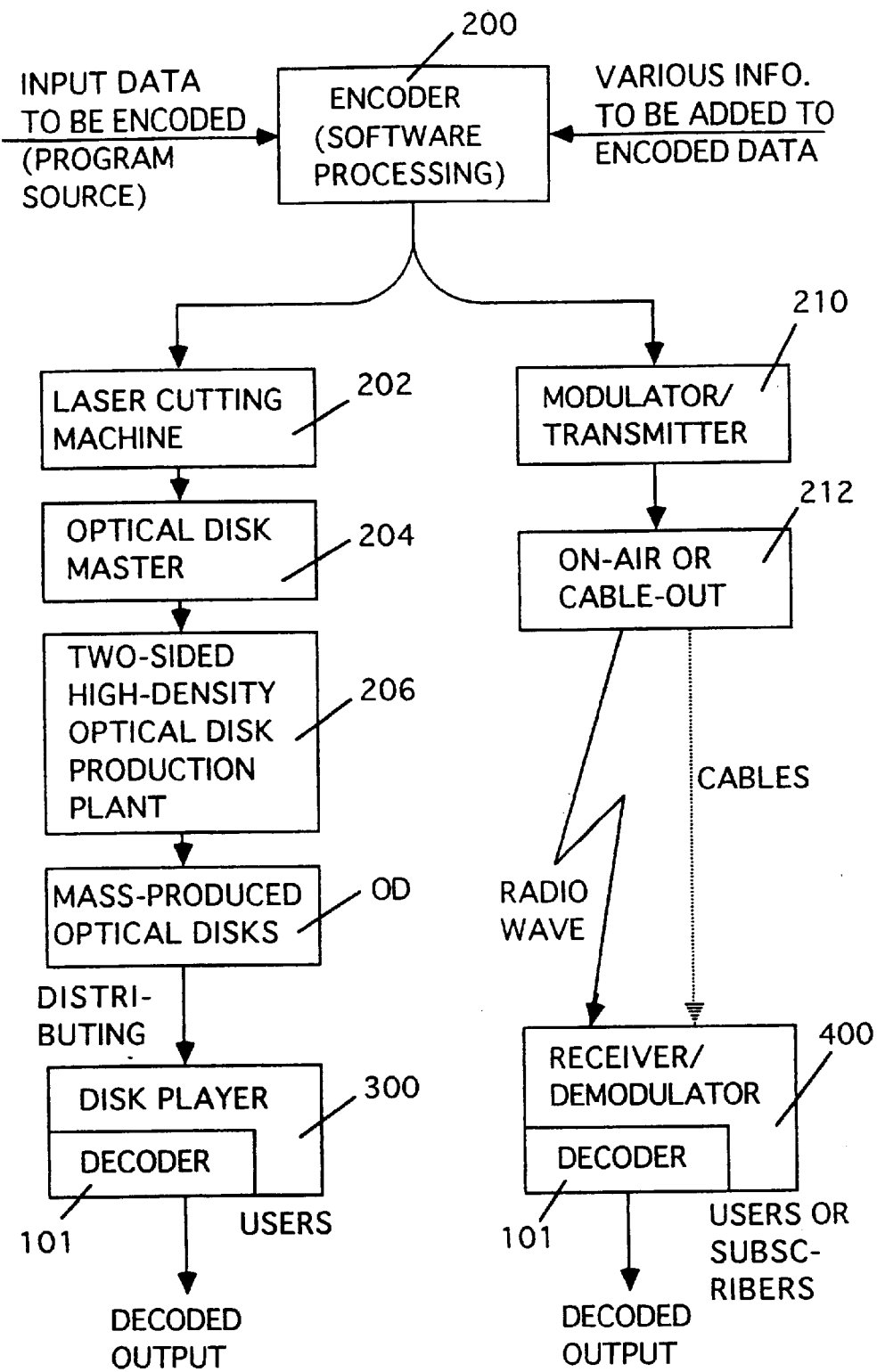
FIG. 10 is a block diagram for explaining the flow of processing from the step of mass-producing a high-density optical disk having image information encoded on the basis of the present invention to the step of playing back the information on the user side, and the flow of processing from the step of broadcasting/cable-distributing of image information encoded on the basis of the present invention to the step of receiving/playing back the information on the user/sub-picture side.

FIG. 10 is a block diagram for explaining the flow of processing from the step of mass-producing high-density optical disks having image information encoded on the basis of the present invention to the step of playing back the information on the user side, together with the flow of processing from the step of broadcasting/cable-distributing image information encoded on the basis of the present invention to the step of receiving/playing back the information on the user/subscriber side.

Assume that run-length data before compressed like the one shown at the intermediate portion in FIG. 7 is input to encoder 200 in FIG. 10. Encoder 200 performs run-length compression (encoding) of the input data by software processing based on compression rules 1 to 6 in FIG. 5.

When data of a logic structure like the one shown in FIG. 2 is to be recorded on optical disk OD in FIG. 1, encoder 200 in FIG. 10 performs run-length compression processing (encoding processing) with respect to sub-picture data in FIG. 3.

Various data required to complete optical disk OD are also input to encoder 200 in FIG. 10. These data are compressed on the basis of, e.g., the standards of MPEG (Motion Picture Expert Group), and the compressed digital data are sent to laser cutting machine 202 or modulator/transmitter 210.

In laser cutting machine 202, the MPEG-compressed data from encoder 200 is recorded on a mother disk (not shown) to manufacture optical disk master 204.

In two-sided high-density optical disk production plant 206, the information of master 204 is transferred onto, e.g., a laser beam reflecting film on a 0.6-mm thick polycarbonate base. Two large-capacity polycarbonate base on which different pieces of master information are respectively transferred are joined to each other to form a 1.2-mm thick two-sided optical disk (or a two-sided disk having one information read surface).

Double-sided high-density optical disks OD mass-produced by plant 206 are distributed to various types of markets and to users.

Distributed disk OD is played back by disk player 300 of the user. Disk player 300 includes decoder 101 for decoding data encoded by encoder 200 into original information. The information decoded by decoder 101 is sent to, e.g., a monitor TV of the user to be visualized. In this manner, the end user can enjoy the original picture information from large-capacity disk OD.

The compressed information sent from encoder 200 to modulator/transmitter 210 is modulated in accordance with predetermined standards and transmitted. For example, the compressed picture information from encoder 200 is broadcasted through a satellite (212), through corresponding audio information. Alternatively, the compressed picture information from encoder 200 is transmitted through a cable (212), together with corresponding audio information.

The compressed picture/audio information broadcasted or transmitted through the cable is received by receiver/demodulator 400 of a user or subscriber. Receiver/demodulator 400 includes decoder 101 for decoding the data encoded by encoder 200 into the original information. The information decoded by decoder 101 is sent to, e.g., the monitor TV of the user to be visualized. In this manner, the end user can enjoy the original picture information from the compressed picture information broadcasted or transmitted through the cable.

Figure 11:
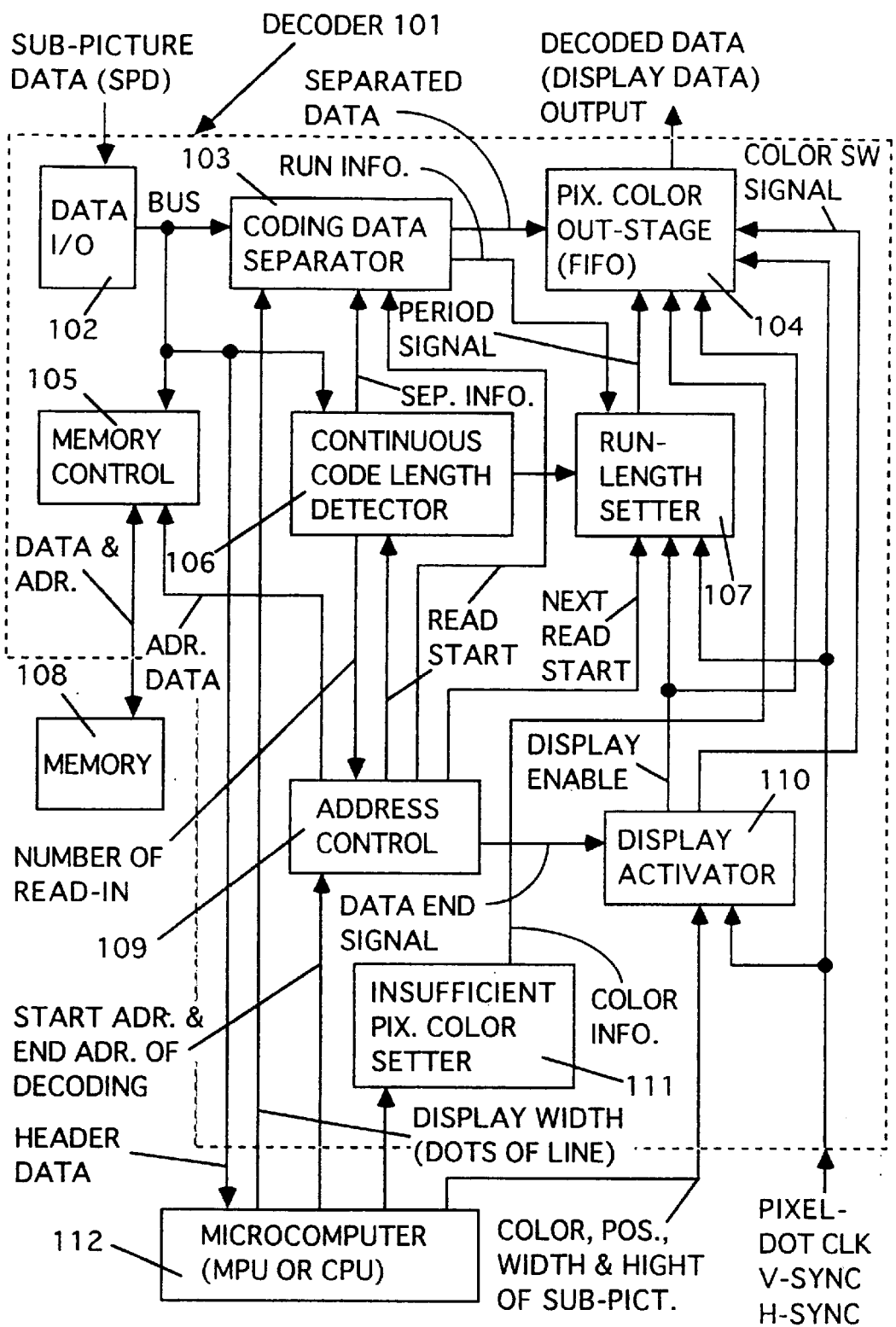
FIG. 11 is a block diagram for explaining an embodiment (non-interlaced specification) of decoder hardware for executing image decoding (run-length expansion) according to the present invention.

FIG. 11 is a block diagram showing an embodiment (non-interlaced specification) of decoder hardware for executing image decoding (run-length expansion) based on the present invention. Decoder 101 (see FIG. 10) for decoding run-length compressed sub-picture data SPD (corresponding to data 32 in FIG. 3) can have an arrangement like the one shown in FIG. 11.

A sub-picture data decoder for run-length expanding a signal containing run-length compressed pixel data having a format like the one shown in FIG. 4 will be described below with reference to FIG. 11.

As shown in FIG. 11, decoder 101 comprises data I/O 102 to which sub-picture data SPD is input; memory 108 retaining sub-picture data SPD; memory control 105 for controlling the read operation of memory 108; continuous code length detector 106 for detecting the continuous code length (coding header) of one unit (one block) from the run information of encoded data (run-length compressed pixel data) read out from memory 108, so as to output separation information for the continuous code length; coding data separator 103 for extracting one-block encoded data in accordance with the information from continuous code length detector 106; run-length setter 107 for receiving a signal output from coding data separator 103 and representing the run information of one compression unit, together with a signal (period signal) output from continuous code length detector 106 and indicating the number of continuous bits "0"s, i.e., the number of data bits "0"s continuing from the start of the coding data of one block, and calculating the number of pixels followed in one block from these signals; pix. color out-stage 104 (Fast-in/Fast-out type) for receiving pixel color information from coding data separator 103 and the period signal output from run-length setter 107 and outputting the color information only for the corresponding interval; microcomputer 112 for loading the header data (see FIG. 4) in sub-picture data SPD read out from memory 108, and performing various types of processing settings and control operations on the basis of the loaded data; address control 109 for controlling the read/write addresses of memory 108; insufficient pix. color setter 111 in which color information corresponding to a line on which no run information is present is set by microcomputer 112; and display activator 110 for determining a display area, of a TV screen or the like, in which a sub-picture is to be displayed.

In other words, as described in FIG. 11, run-length compressed sub-picture data SPD is sent to the internal bus of decoder 101 through data I/O 102. Sub-picture data SPD sent to the bus is supplied to memory 108 through memory control 105 to be stored therein. The internal bus of decoder 101 is connected to coding data separator 103, continuous code length detector 106, and microcomputer (MPU or CPU) 112.

Sub-picture unit header 31 of the sub-picture data obtained from memory 108 is read by microcomputer 112. Microcomputer 112 detects the various parameters shown in FIG. 4 from read sub-picture unit header 31. In accordance with the detected parameters, the start address of decoding (SPDDADR) is set at address controller 109; display activator 110 receives information (SPDSIZE) indicating the display start position, display width, and display height of the sub-picture; and coding data separator 103 receives display width (or the number of dots of the line) of the sub-picture. The parameters detected by microcomputer 112 are then stored in the internal registers of respective circuit blocks (109, 110, and 103). Thereafter, microcomputer 112 can access the parameters stored in the circuit blocks (109, 110, and 103).

Address controller 109 accesses memory 108 through memory controller 105 in response to the starting address (SPDDADR) of decoding set at the register of controller 109, so that the reading of the sub-picture data to be decoded starts. The sub-picture data read from memory 108 is supplied to coding data separator 103 and to continuous code length detector 106.

The coding header (2 to 14 bits according to rules 2 to 5 in FIG. 5) of run-length compressed sub-picture data SPD is detected by continuous code length detector 106. The number of continuous pixels of identical pixel data in sub-picture data SPD is detected by run-length setter 107 based on a signal from continuous code length detector 106.

More specifically, continuous code length detector 106 counts the number of bits of "0" in the data read from memory 108 in order to detect the coding header (cf. FIG. 5). In accordance with the value or content of the detected coding header, detector 106 supplies separation information SEP.INFO. to coding data separator 103.

In response to separation information SEP.INFO., coding data separator 103 sets the continuous pixel numbers (run information) at run length setter 107. At the same time, separator 103 sets the pixel data (separated data indicating the pixel color) at pixel color output stage 104 of a FIFO (first-in/first-out) type. In this case, coding data separator 103 counts the pixel number of the sub-picture data, and compares the counted pixel number with the display width (or the number of pixels on one line) of the sub-picture.

Here, if no byte-aligning is established when the decoding of one line is completed (or if the bit length of one line data is not the integral of the unit of number "8"), coding data separator 103 discards or neglects the trailing 4-bit data on the line, regarding as the dummy data added at the time of encoding.

Run-length setter 107 supplies pixel color output stage 104 with a PERIOD SIGNAL for outputting the pixel data, based on the continuous pixel number (run information), pixel dot clock DOTCLK, and horizontal/vertical sync signals H-SYNC/V-SYNC. Pixel color output stage 104 outputs the pixel data from coding data separator 103, as the decoded display data, during the active period of the pixel data output signal (PERIOD SIGNAL), or during the period of outputting the same pixel color.

Within the above-mentioned active period of the PERIOD SIGNAL, if the start line of decoding is changed by the instruction from microcomputer 112, a certain line(s) having no run information could exists. When the no-run-information line(s) is(are) found during the decoding, insufficient pixel color setter 111 sends data (COLOR INFO.) of preset insufficient pixel color to pixel color output stage 104. Then, pixel color output stage 104 outputs the data (COLOR INFO.) of the insufficient pixel color from insufficient pixel color setter 111, so long as the no-run-information line(s) is(are) input to coding data separator 103.

More specifically, in the case of decoder 101 in FIG. 11, if input sub-picture data SPD includes no image data, microcomputer 112 sets pixel color information as shortage data in insufficient pix. color setter 111.

A display enable signal for determining a specific position on a monitor screen (not shown) at which a decoded sub-picture is to be displayed is supplied from display activator 110 to pix. color out-stage 104 in synchronism with a horizontal/vertical sync signal for a sub-picture image. Display activator 110 sends a color switching signal to pix. color out-stage 104 in accordance with a color information instruction from microcomputer 112.

After the processing settings of microcomputer 112, address control 109 sends address data and various timing signals to memory control 105, continuous code length detector 106, coding data separator 103, and run-length setter 107.

When a pack of sub-picture data SPD is received through data I/O 102 and stored in memory 108, microcomputer 112 reads the contents of the pack header of data SPD (e.g., a start address of decoding, an end address of decoding, a display start position, a display width, and a display height). Microcomputer 112 sets a start address of decoding, an end address of decoding, a display start position, a display width, a display height, and the like in display activator 110 on the basis of the read contents. At this time, a specific bit configuration of compressed pixel data (2-bit pixel data in this case) can be determined by the contents of sub-picture unit header 31 in FIG. 4.

The operation of decoder 101 in a case wherein compressed pixel data has a 2-bit configuration (rules 1 to 6 in FIG. 5 are used) will be described.

When the start address decoding is set by microcomputer 112, address control 109 sends corresponding address data to memory control 105, and a read start signal to continuous code length detector 106.

In response to the sent read start signal, continuous code length detector 106 sends a read signal to memory control 105 to load encoded data (compressed sub-picture data 32). Continuous code length detector 106 then checks whether all the upper 2 bits of the read data are "0"s.

If all the bits are not "0"s, it is determined that the block length of the unit of compression is 4 bits (see rule 1 in FIG. 5).

If the bits (upper 2 bits) are "0"s, the subsequent 2 bits (upper 4 bits) are checked. If they are not "0"s, it is determined that the block length of the unit of compression is 8 bits (see rule 2 in FIG. 5).

If the bits (upper 4 bits) are "0"s, the subsequent 2 bits (upper 6 bits) are checked. If they are not "0"s, it is determined that the block length of the unit of compression is 12 bits (see rule 3 in FIG. 5).

If the bits (upper 6 bits) are "0"s, the subsequent 8 bits (upper 14 bits) are further checked. If they are not "0"s, it is determined that the block length of the unit of compression is 16 bits (see rule 4 in FIG. 5).

If the bits (upper 14 bits) are "0"s, it is determined that the block length of the unit of compression is 16 bits, and identical pixel data continue up to the end of the line (see rule 5 in FIG. 5).

If the number of bits of the pixel data read up to the end of the line is an integer multiple of 8, the pixel data is used as it is. If the number of bits is not an integer multiple of 8, it is determined that 4-bit dummy data is required at the end of the read data to realize byte-aligning (see rule 6 in FIG. 5).

Coding data separator 103 extracts 1-block data (the unit of compression) of sub-picture data 32 from memory 108 on the basis of the above determination result obtained by continuous code length detector 106. Coding data separator 103 separates the extracted 1-block data into the number of pixels followed and pixel data (e.g., pixel color information). The separated data of the number of pixels followed (RUN INFO.) is sent to run-length setter 107, and the separated pixel data (SEPARATED DATA) is sent to pix. color out-stage 104.

Display activator 110 generates a display enable signal (enable signal) for designating a sub-picture display interval in synchronism with a pixel dot clock (PIXEL-DOT CLK), a horizontal sync signal (H-SYNC), and a vertical sync signal (V-SYNC) in accordance with the display start position information, the display width information, and the display height information received from microcomputer 112. This display enable signal is output to run-length setter 107.

Run-length setter 107 receives a signal output from continuous code length detector 106 and indicating whether the current block data continues to the line end, and continuous pixel data (RUN INFO.) from coding data separator 103. On the basis of the signal from continuous code length detector 106 and the data from coding data separator 103, run-length setter 107 determines the number of pixel dots of a block which is being decoded, and outputs a display enable signal (output enable signal) to pix. color out-stage 104 during an interval corresponding to the number of dots.

Pix. color out-stage 104 is enabled during an interval in which an period signal is received from run-length setter 107. In this interval, pix. color out-stage 104 sends the pixel color information received from coding data separator 103, as decoded display data, to a display unit (not shown) in synchronism with the pixel dot clock (PIXEL-DOT CLK). That is, pix. color out-stage 104 outputs the same display data corresponding to the pixel pattern continuous dots of the block which is being decoded.

Upon determining that the encoded data are identical pixel color data continuing to the line end, continuous code length detector 106 outputs a signal for a continuous code length of 16 bits to coding data separator 103, and also output, to run-length setter 107, a signal indicating that identical pixel data continue up to the line end.

Upon reception of the above signal from continuous code length detector 106, run-length setter 107 outputs an output enable signal (period signal) to pix. color out-stage 104 to keep the color information of the encoded data in an enable state until horizontal sync signal H-SYNC is inactivated.

When microcomputer 112 changes the start line of decoding to scroll the displayed contents of a sub-picture, no data line used for decoding may be present in a preset display area (i.e., a decoding line shortage may occur).

In decoder 101 in FIG. 11, in order to cope with such a case, pixel color data for compensating for a line shortage is prepared in advance. When a line shortage is actually detected, the current display mode is switched to an insufficient pixel color data display mode. More specifically, when a data end signal is supplied from address control 109 to display activator 110, display activator 110 sends a color switching signal (COLOR SW SIGNAL) to pix. color out-stage 104. In response to this switching signal, pix. color out-stage 104 switches the mode of outputting decoded pixel color data from the encoded data to the mode of outputting decoded color information (COLOR INFO.) from display activator 110. This switched state is kept during an insufficient line display interval (DISPLAY ENABLE=active).

When the above line shortage occurs, a decoding operation may be stopped instead of using insufficient pixel color data.

More specifically, when, for example, a data end signal is input from address control 109 to display activator 110, a color switching signal for designating a display stop may be output from display activator 110 to pix. color out-stage 104. Pix. color out-stage 104 keeps stopping the display of a sub-picture during an interval in which this display stop designation color switching signal is active.

FIG. 8 shows two display modes (non-interlaced display and interlaced display) to explain how character pattern "A" of the pixel data (sub-picture data) encoded in FIG. 7 is decoded.

Decoder 101 in FIG. 11 can be used to decode compressed data like the one shown at the upper portion in FIG. 8 into interlaced display data like the one shown at the lower left portion in FIG. 8.

In contrast to this, when compressed data like the one shown at the upper portion in FIG. 8 is to be decoded into interlaced display data shown at the lower right portion in FIG. 8, a line doubler for scanning the same pixel line twice (e.g., re-scanning line #10, in an even field, which has the same contents as those of line #1 in an odd field; switching in units of V-SYNC pulses) is required.

When an image display amount equivalent to that in the interlaced display mode is to be displayed in the non-interlaced display mode, another line doubler (e.g., line #10 having the same contents as those of line #1 at the lower end portion in FIG. 8 is made to follow line #1; switching in units of H-SYNC pulses).

Figure 12:
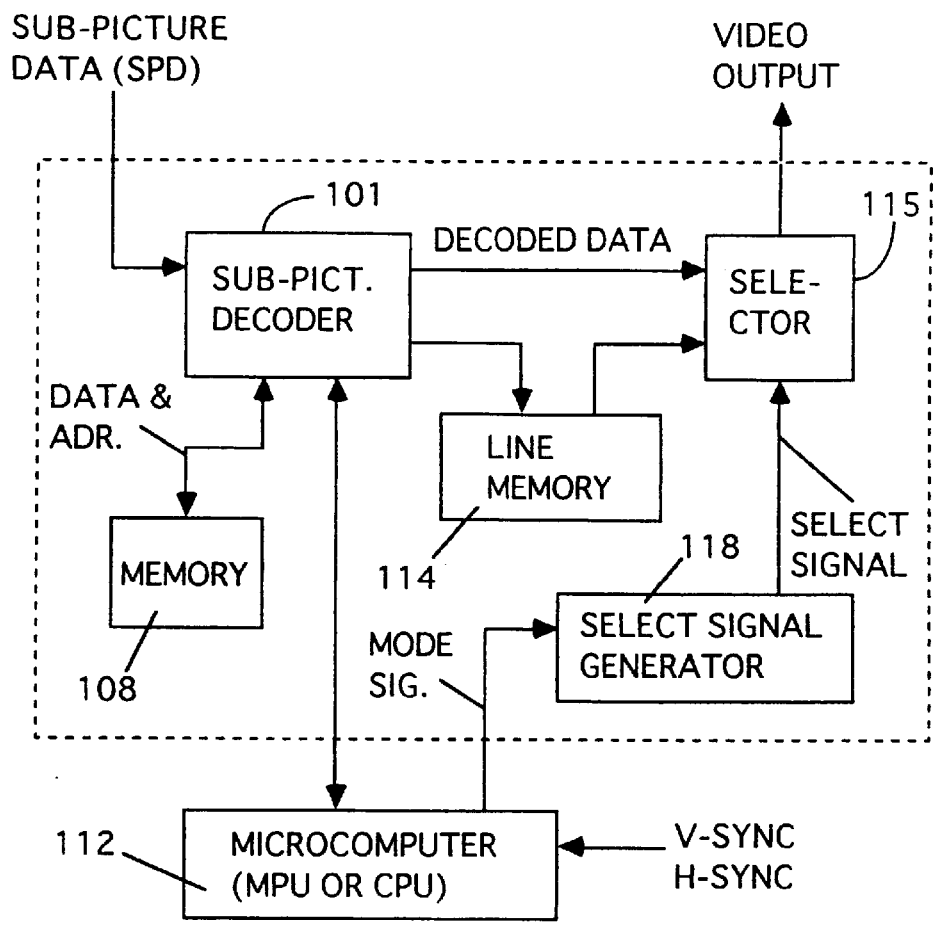
FIG. 12 is a block diagram for explaining another embodiment (interlaced specification) of decoder hardware for executing image decoding (run-length expansion) according to the present invention.

FIG. 12 is a block diagram for explaining an embodiment (interlaced specifications) of decoder hardware having the above line doubler function. Decoder 101 in FIG. 10 may be constituted by a decoder having the arrangement shown in FIG. 12.

In the arrangement in FIG. 12, microcomputer 112 detects the generation timings of odd and even fields in the interlaced display mode on the basis of a horizontal/vertical sync signal for a sub-picture.

Upon detection of an odd field, microcomputer 112 supplies, to select signal generator 118, a mode signal indicating that the current field is an odd field. As a result, select signal generator 118 outputs a signal to selector 115 to select decoded data from decoder 101. Decoder 101 then outputs the pixel data (see the lower right portion in FIG. 8) of lines #1 to #9 in the odd field, as an video output, to an external unit through selector 115. In this case, the pixel data of lines #1 to #9 in the odd field are temporarily stored in line memory 114.

Upon detecting that the odd field has shifted to an even field, microcomputer 112 supplies, to select signal generator 118, a mode signal indicating that the current field is an even field. As a result, select signal generator 118 outputs a signal to selector 115 to select the data stored in line memory 114. Line memory 114 then outputs the pixel data (see the lower right portion in FIG. 8) of lines #10 to #18 in the even field, as a video output, to the external unit through selector 115.

In this manner, the sub-picture image (character "A" in FIG. 8) of lines #1 to #9 in the odd field is synthesized with the sub-picture image (character "A" in FIG. 8) of lines 10# to #18 in the even field, thereby realizing interlaced display.

Note that sub-picture unit header 31 of the sub-picture data in FIG. 4 includes a parameter bit (SPMOD) indicating a frame display mode/field display mode for a TV screen.

For example, an image display amount equivalent to that in the interlaced display mode is displayed in the non-interlaced display mode in the following manner.

Upon loading sub-picture unit header 31, microcomputer 112 in FIG. 12 can determine from the set value of parameter SPMOD (active="1"; inactive="0") whether the interlaced mode (active "1") or the non-interlaced mode (inactive "0") is set.

In the arrangement in FIG. 12, if parameter SPMOD is active="1", microcomputer 112 detects that the interlaced mode is set, and sends a mode signal indicating the interlaced mode to select signal generator 118. Select signal generator 118 supplies a switching signal to selector 115 every time horizontal sync signal H-SYNC is generated. Selector 115 alternately switches the decoded output (decoded data) of the current field from decoder 101 and the decoded output of the current field temporarily stored in line memory 114 every time horizontal sync signal H-SYNC is generated, and outputs a video output to an external TV set or the like.

When the current decoded data and the decoded data in line memory 114 are switched for each H-SYNC, a picture having a density (the number of horizontal scanning lines) twice that of the original image (decoded data) is displayed on the TV screen in the interlaced mode.

In decoder 101 having the above arrangement, sequentially input bit data are read by 2 to 16 bits while being counted bit by bit from the beginning of a decoded data unit block, and are decoded, instead of being decoded after read by one line. In this case, the bit length (4 bits, 8 bits, 12 bits, 16 bits, or the like) of one decoded data unit is detected immediately before a decoding operation. For example, compressed pixel data is decoded (played back) into three types of pixels ("●", "○", and "#" in FIG. 7) in real time in the unit of the detected data length.

In decoding pixel data encoded according to rules 1 to 6 in FIG. 5, decoder 101 may have a bit counter and a data buffer (line memory 114 or the like) having a relatively small capacity. In other words, the circuit arrangement of decoder 101 can be relatively simplified, and the overall apparatus including this encoder can be reduced in size.

That is, the encoder of the present invention requires no large code table in the coder unlike in the conventional MH coding method, and need not read the same data twice in an encoding operation unlike in the arithmetic coding method. In addition, the decoder of the present invention requires no relatively complicated hardware like a multiplier, and can be realized by adding simple circuits such as a counter and a small-capacity buffer.

According to the present invention, run-length compression/encoding and run-length expansion/decoding of many types of pixel data (a maximum of four types of pixel data each having a 2-bit configuration) can be realized with a relatively simple arrangement.

Figure 13:
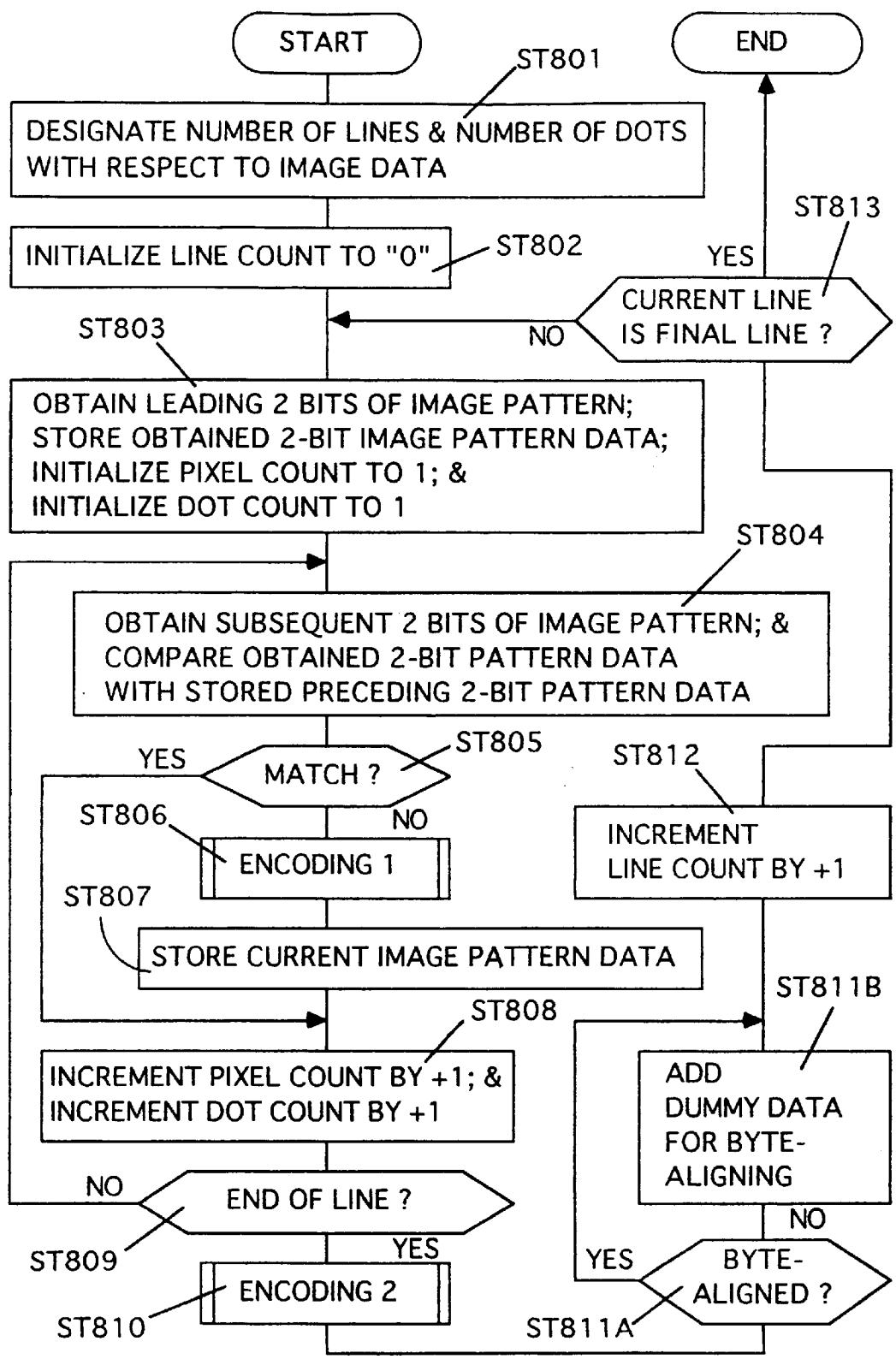
FIG. 13 is a flow chart for explaining software for the execution of image encoding (run-length compression) according to an embodiment of the present invention, which is executed, for example, by an encoder (200) in FIG. 10.

FIG. 13 is a flow chart for executing image encoding (run-length compression) according to an embodiment of the present invention and for explaining software executed by the encoder (200) in FIG. 10.

A series of encoding operations based on rules 1 to 6 in FIG. 5 is executed, as software processing, by the microcomputer in encoder 200 in FIG. 10. The overall encoding processing can be performed by encoder 200 in accordance with the flow chart in FIG. 13. Run-length compression of image data in sub-picture data can be performed in accordance with the flow chart in FIG. 14.

In this case, when the number of lines and the number of dots of image data are designated by a key input operation (step ST801), the computer in the encoder 200 prepares a header area for sub-picture data, and initializes the line count to "0" (step ST802).

When an image pattern is sequentially input in units of bits, the computer in the encoder 200 obtains the first 1-pixel data (2 bits in this case), and stores the pixel data. In addition, the computer initializes the pixel count to "1", and the dot count to "1" (step ST803).

Subsequently, the computer in encoder 200 obtains the next pixel data (2 bits) of the pixel pattern, and compares it with the stored preceding image data (step ST804).

If it is determined from the comparison result that the pixel data do not match each other (NO in step ST805), encoding 1 is performed (step ST806), and the current pixel data is stored (step ST807). The pixel count is then incremented by one, and the dot count is also incremented by one accordingly (step ST808).

If it is determined from the comparison result that the pixel data match each other (YES in step ST805), encoding 1 in step ST806 is skipped, and the flow advances to step ST808.

After the pixel count and the dot count are incremented (step ST808), the computer in encoder 200 checks whether a pixel line which is currently encoded is the end of a pixel line (step 809). If the pixel line is the end of the line (YES in step ST809), encoding 2 is performed (step ST810). If the pixel line is not the end of the line (NO in step ST809), the flow returns to step ST840, and the processing in steps ST804 to ST808 is repeated.

Upon completion of encoding 2 in step ST810, the computer in encoder 200 checks whether a bit string after encoding is an integer multiple of 8 bits (byte-aligned) (step ST811A). If the bit string is not byte-aligned (NO in step ST811A), 4-bit dummy data (0000) is added to the end of the bit string after encoding (step ST811B). After this dummy addition processing, or if the bit string after encoding is byte-aligned (YES in step ST811A), the line counter of the computer in the encoder (e.g., the general-purpose register in the microcomputer) is incremented by one (step ST812).

If the current line is not the final line (NO in step ST813) after the line counter is incremented, the flow returns to step ST803, and the processing in steps ST803 to ST812 is repeated.

If the current line is the final line (YES in step ST813) after the line counter is incremented, the encoding processing (run-length compression of the bit string of the 2-bit pixel data) is completed.

Figure 14:
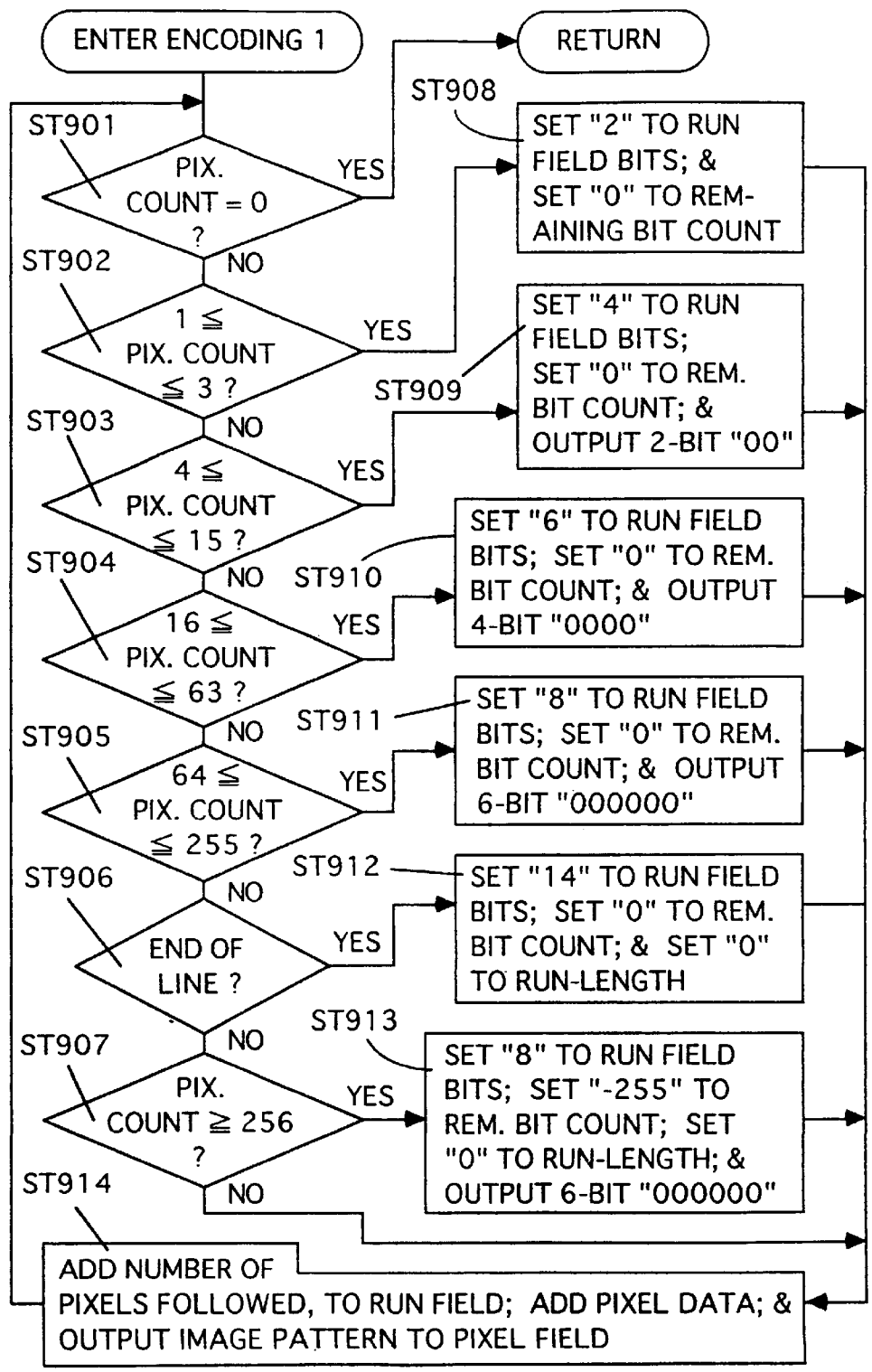
FIG. 14 is a flow chart for explaining the contents of encoding step 1 (ST806) used in the software in FIG. 13.

FIG. 14 is a flow chart for explaining the contents of encoding 1 in FIG. 13.

In encoding 1 (step ST806) in FIG. 13, pixel data to be encoded is assumed to have a 2-bit width, and hence run-length compression rules 1 to 6 in FIG. 5 are used.

In correspondence with rules 1 to 6, computer software is executed to determine whether the pixel count is 0 (step ST901), 1 to 3 (step ST902), 4 to 15 (step ST903), 16 to 63 (step ST904), or 64 to 255 (step ST905), or indicates the end of a line (step ST906), or is 256 or more (step ST907).

The computer in encoder 200 determines the number of run field bits (one unit length of identical pixel data) on the basis of the above determination result (steps ST908 to ST913), and ensure an area corresponding to the determined number of run field bits after sub-picture unit header 31. The number of pixels followed is output to the run field ensured in this manner, and the pixel data is output to the pixel field. These data are recorded in a memory unit (not shown) in encoder 200 (step ST914).

Figure 15:
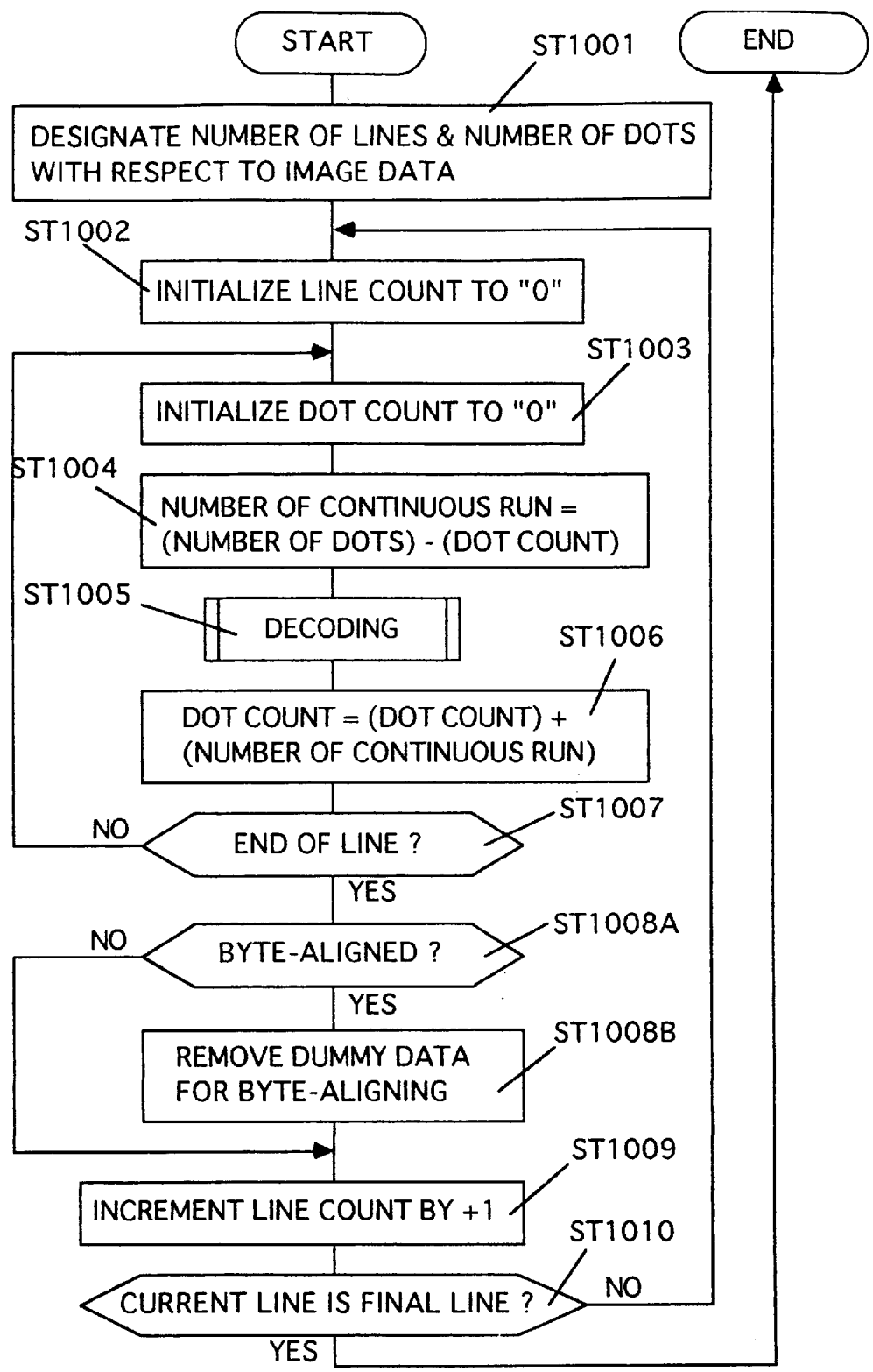
FIG. 15 is a flow chart for explaining software for the execution of image decoding (run-length expansion) according to an embodiment of the present invention, which is executed by an MPU (112) in FIG. 11 or 12.

FIG. 15 is a flow chart for executing image decoding (run-length expansion) according to an embodiment of the present invention, and for explaining software executed by microcomputer 112 in FIG. 11 or 12.

Figure 16:
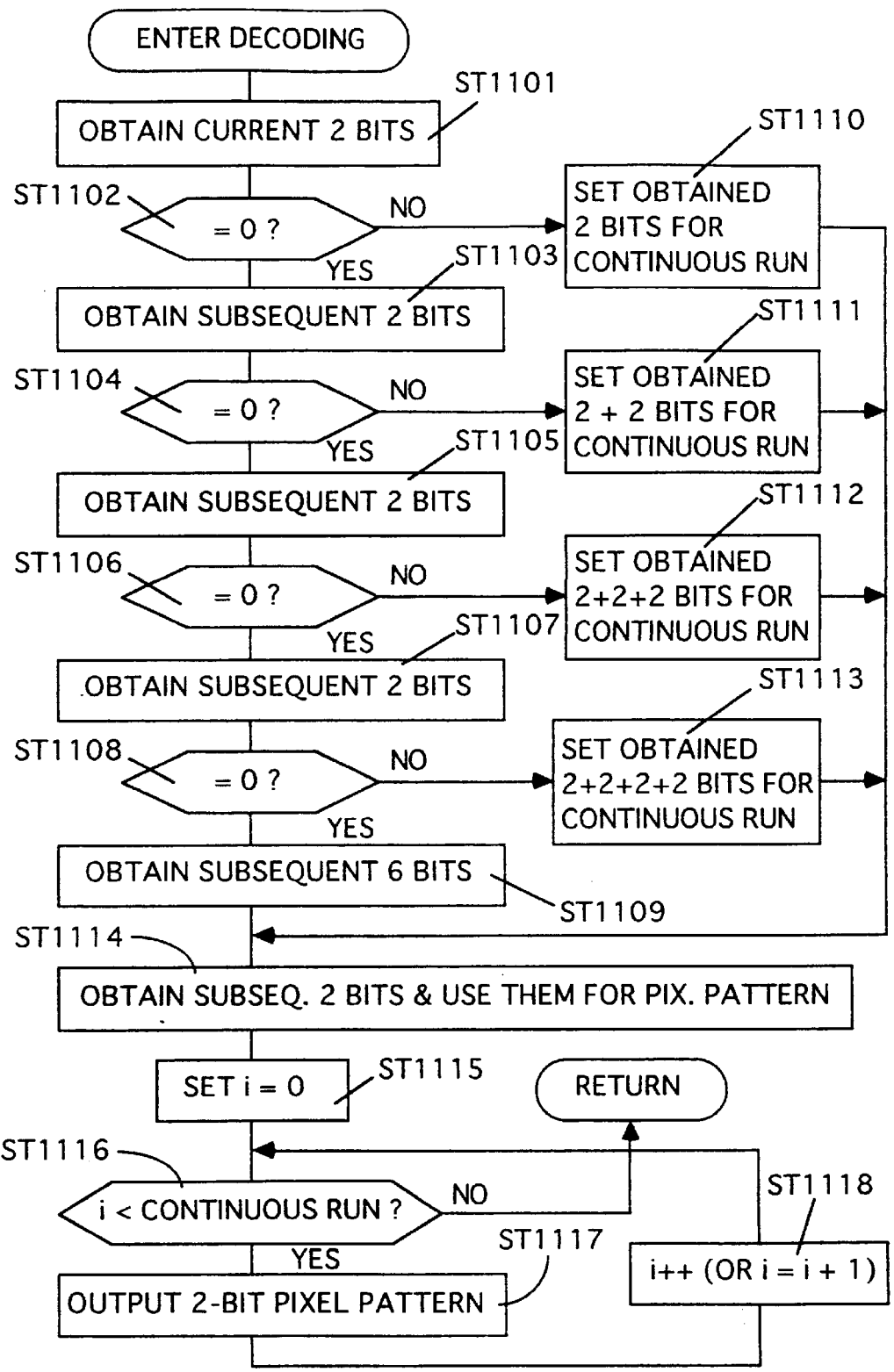
FIG. 16 is a flow chart for explaining the contents of decoding step (ST1005) used in the software in FIG. 15.

FIG. 16 is a flow chart for explaining the contents of the decoding step (step ST1005) used in the software in FIG. 15.

Microcomputer 112 loads first header 31 of run-length compressed sub-picture data (pixel data has a 2-bit configuration), and analyzes its contents (see FIG. 4). The data is then decoded on the basis of the analyzed contents of the header. The number of lines and the number of dots of the data are designated. When the number of lines and the number of dots are designated (step ST1001), the line count and the dot count are initialized to "0" (steps ST1002 and ST103).

Microcomputer 112 sequentially receives the data bit string following sub-picture unit header 31, and counts the number of dots and the dot count. Microcomputer 112 then subtracts the dot count from the number of dots to obtain the number of pixels followed (step ST1004).

Upon calculating the number of pixels followed in this manner, microcomputer 112 executes decoding in accordance with the number of pixels followed (step ST1005).

After the decoding processing in step ST1005, microcomputer 112 adds the dot count to the number of pixels followed to obtain a new dot count (step ST1006).

Microcomputer 112 sequentially loads data and executes the decoding processing in step ST1005. When the accumulated dot count coincides with the initially set line end count (the position of the end of the line), microcomputer 112 terminates decoding processing for 1-line data (YES in step ST1007).

If the decoded data is byte-aligned (YES in step ST1008A), dummy data is removed (step ST1008B). The line count is then incremented by one (step ST1009). The processing in steps ST1002 to ST1009 is repeated until the final line (NO in step ST1010). If the current line is the final line (YES in step ST1010), the decoding processing is terminated.

For example, FIG. 16 shows the contents of the decoding processing in step ST1005 in FIG. 15.

From the beginning of this processing, 2 bits are obtained, and it is checked whether the bits are "0". This determination step is repeated (steps ST1101 to ST1109). With this processing, the number of pixels followed, i.e., the number of continuous runs, corresponding to run-length compression rules 1 to 6 is determined (steps ST1110 to ST113).

After the number of continuous runs is determined, the subsequent 2 bits obtained afterward is used as a pixel pattern (pixel data; pixel color information) (step ST1114).

When the pixel data (pixel color information) is determined, index parameter "i" is set to 0 (step ST1115). Until parameter "i" coincides with the number of continuous runs (step ST1116), a 2-bit pixel pattern is output (step ST1117), and parameter "i" is incremented by one (step ST1118). After identical data corresponding to one unit is output, the decoding processing is completed.

As described above, according to this sub-picture decoding method, sub-picture data can be decoded by simple processing, i.e., only determination processing for several bits, data block separation processing, and data bit counting processing. For this reason, a large code table used in the conventional MH coding method or the like is not required, and the processing/arrangement for decoding encoded bit data into original pixel information can be simplified.

In the above embodiment, the encoded bit length of identical pixels corresponding to one unit can be determined by reading a maximum of 16-bit data in a decoding operation. However, the encoded bit length is not limited to this value. For example, the encoded bit length may be 32 or 64 bits. However, as the bit length increases, a data buffer having a larger capacity is required.

In addition, in the above embodiment, pixel data (pixel color information) includes pieces of color information of three colors selected from, e.g., a 16-color color palette. Instead of using such pixel data, pieces of amplitude information of the three primary colors (e.g., red R, green G, and blue B; or intensity Y, chroma-red Cr, and chroma-blue Cb) can be expressed by 2-bit pixel data. That is, pixel data is not limited to specific color information.

Figure 17:
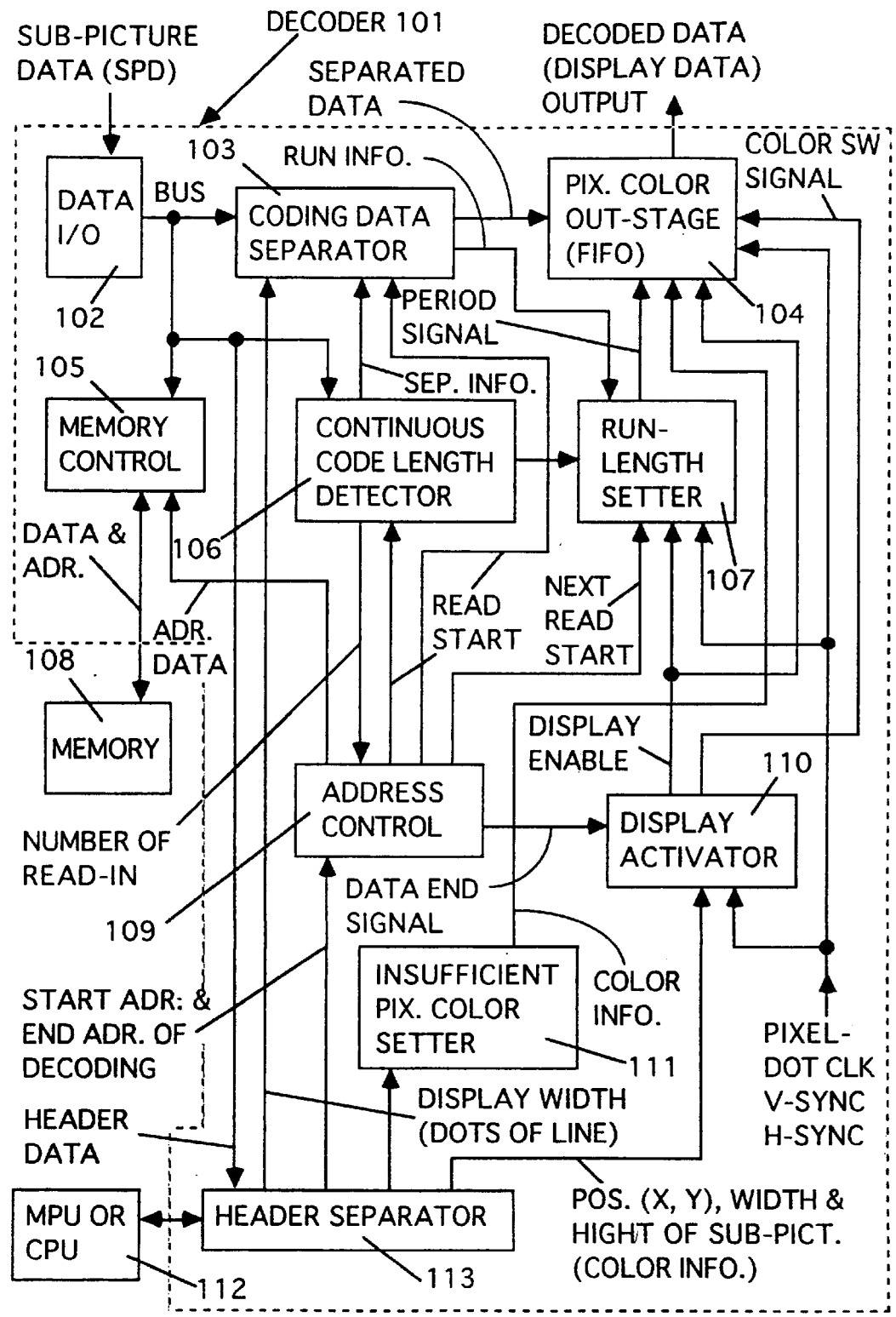
FIG. 17 is a block diagram for explaining another embodiment of the decoder hardware by which the image decoding (run-length expansion) according to the present invention is executed.

FIG. 17 shows a modification of the embodiment of FIG. 11. In the embodiment of FIG. 11, the coding header is separated by microcomputer 112 in software basis. On the other hand, in the embodiment of FIG. 17, the coding header is separated based on the hardware in decoder 101.

More specifically, as shown in FIG. 17, sub-picture data SPD subjected to the run-length compression is sent, via data I/O 102, to the internal bus of decoder 101. Sub-picture data SPD on the internal bus is sent to memory 108 through memory controller 105, and is then stored in memory 108. The internal bus of decoder 101 is connected to coding data separator 103, to continuous code length detector 106, and to header separator 113 which is coupled to microcomputer (MPU or CPU) 112.

Sub-picture unit header 31 of the sub-picture data read from memory 108 is read by header separator 113. Separator 113 detects various parameters shown in FIG. 4 from read header 31. Based on the detected parameters, separator 113 sets at address controller 109 the start address (SPDDADR) of decoding; at display activator 110 the information (SPDSIZE) of the display width and display height of the sub-picture as well as the display start position of the sub-picture; and at coding data separator 103 the display width (the number of dots of the line). These set information pieces are stored in the internal registers of corresponding circuit blocks (109, 110, and 103). Thereafter, microcomputer 112 can access the parameters stored in the circuit blocks (109, 110, and 103).

Address controller 109 accesses memory 108 through memory controller 105 in response to the starting address (SPDDADR) of decoding set at the register of controller 109, so that the reading of the sub-picture data to be decoded starts. The sub-picture data read from memory 108 is supplied to coding data separator 103 and to continuous code length detector 106.

The coding header (e.g., 2 to 14 bits of rules 2 to 5 in FIG. 5) of run-length-compressed sub-picture data SPD is detected by continuous code length detector 106. The number of pixels followed with respect to the same pixel data within sub-picture data SPD is detected by run-length setter 107 in accordance with the signal from continuous code length detector 106.

Another decoding method differing from the decoding method of FIGS. 15 and 16 will be explained with reference to FIGS. 17 to 21.

Figure 18:
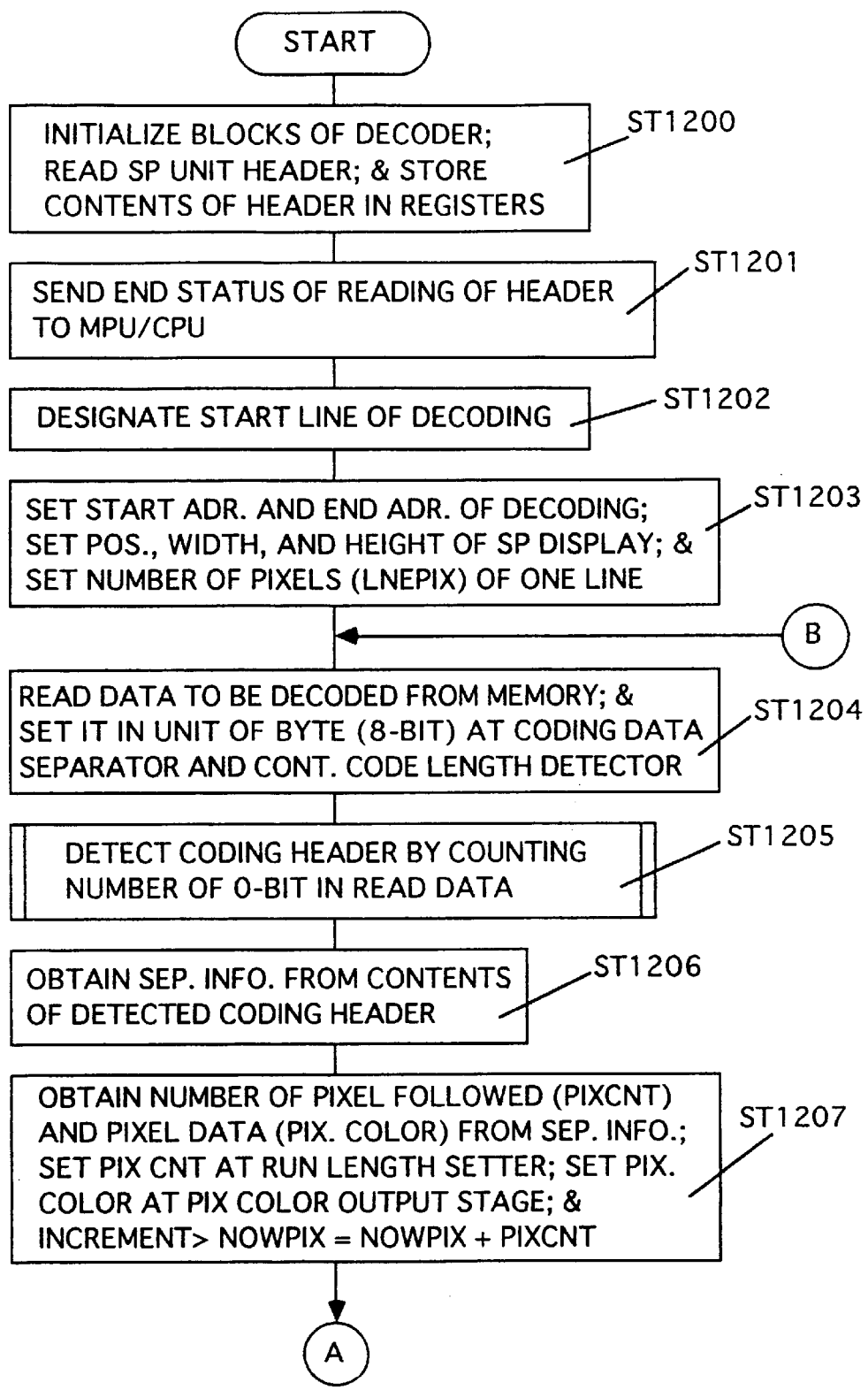
FIG. 18 is a flow chart for explaining the former processing of the image decoding (run-length expansion) according to another embodiment of the present invention.

FIG. 18 is a flow chart for explaining the former processing of the image decoding (run-length expansion) according to another embodiment of the present invention.

When the decoding starts, respective blocks in decoder 101 of FIG. 17 are initialized (e.g., registers are cleared and counters are reset). Thereafter, sub-picture unit header 31 is read, and the contents (various parameters shown in FIG. 4) of header 31 are set at internal registers of header separator 113 (step ST1200).

After the parameters of header 31 are set at the registers of header separator 113, microcomputer 112 is informed of the end status of reading of header 31 (step ST1201).

When microcomputer 112 receives the end status of header reading, it designates the start line of decoding (e.g., SPLine 1 in FIG. 4). The designated start line of decoding is sent to header separator 113 (step ST1202).

When header separator 113 receives the designated start line of decoding, separator 113 refers to the various parameters set in its own registers. Then, according to the parameters set in the registers of separator 113, the following data set operations are performed (step ST1203):

the designated decoding start line address (SPDDADR in FIG. 4) and the decoding end address (SPEDADR in FIG. 4; the address obtained by relatively-shifting by one line from the start line address) are set at address controller 109;

the display start position, display width, and display height of the decoded sub-picture (SPDSIZE in FIG. 4) are set at display activator 110; and the width of display (LNEPIX; although not shown, LNEPIX is part of SPDSIZE in FIG. 4 and indicates the number of dots on one line) is set at coding data separator 103.

Address controller 109 sends the decoding addresses to memory controller 105. Then, the data to be decoded (i.e., compressed sub-picture data SPD) is read, via memory controller 105, from memory 108 to coding data separator 103 and to continuous code length detector 106. In this case, the read data is set at respective registers of separator 103 and detector 106 in unit of RbyteS (step ST1204).

Continuous code length detector 106 counts the number of 0-bit of the data read from memory 108, and detects the coding header corresponding to either of rules 1 to 5 shown in FIG. 5 (step ST1205). Details of detection of the coding header will be described later with reference to FIG. 20.

Then, continuous code length detector 106 generates separation information SEP.INFO. corresponding to either of rules 1 to 5 shown in FIG. 5 (step ST1206).

More specifically, for example, when the count of 0-bit of data read from memory 108 is zero, separation information SEP.INFO. indicating rule 1 is obtained; when the count of 0-bit of data read from memory 108 is two, separation information SEP.INFO. indicating rule 2 is obtained; when the count of 0-bit of data read from memory 108 is four, separation information SEP.INFO. indicating rule 3 is obtained; when the count of 0-bit of data read from memory 108 is six, separation information SEP.INFO. indicating rule 4 is obtained; and when the count of 0-bit of data read from memory 108 is fourteen, separation information SEP.INFO. indicating rule 5 is obtained. The separation information SEP.INFO. thus obtained is sent to coding data separator 103.

In accordance with the content of separation information SEP.INFO. from continuous code length detector 106, coding data separator 103 sets the number of pixels followed (PIXCNT; run information) at run length setter 107. Further, coding data separator 103 sets at pixel color output stage 104 the 2-bit pixel data (pixel color data picked up from the sub-picture data packet) subsequent to the number of pixels followed. At this time, current count value NOWPIX of a pixel counter (not shown) in separator 103 is incremented by number PIXCNT of pixels followed (step ST1207).

Figure 19:
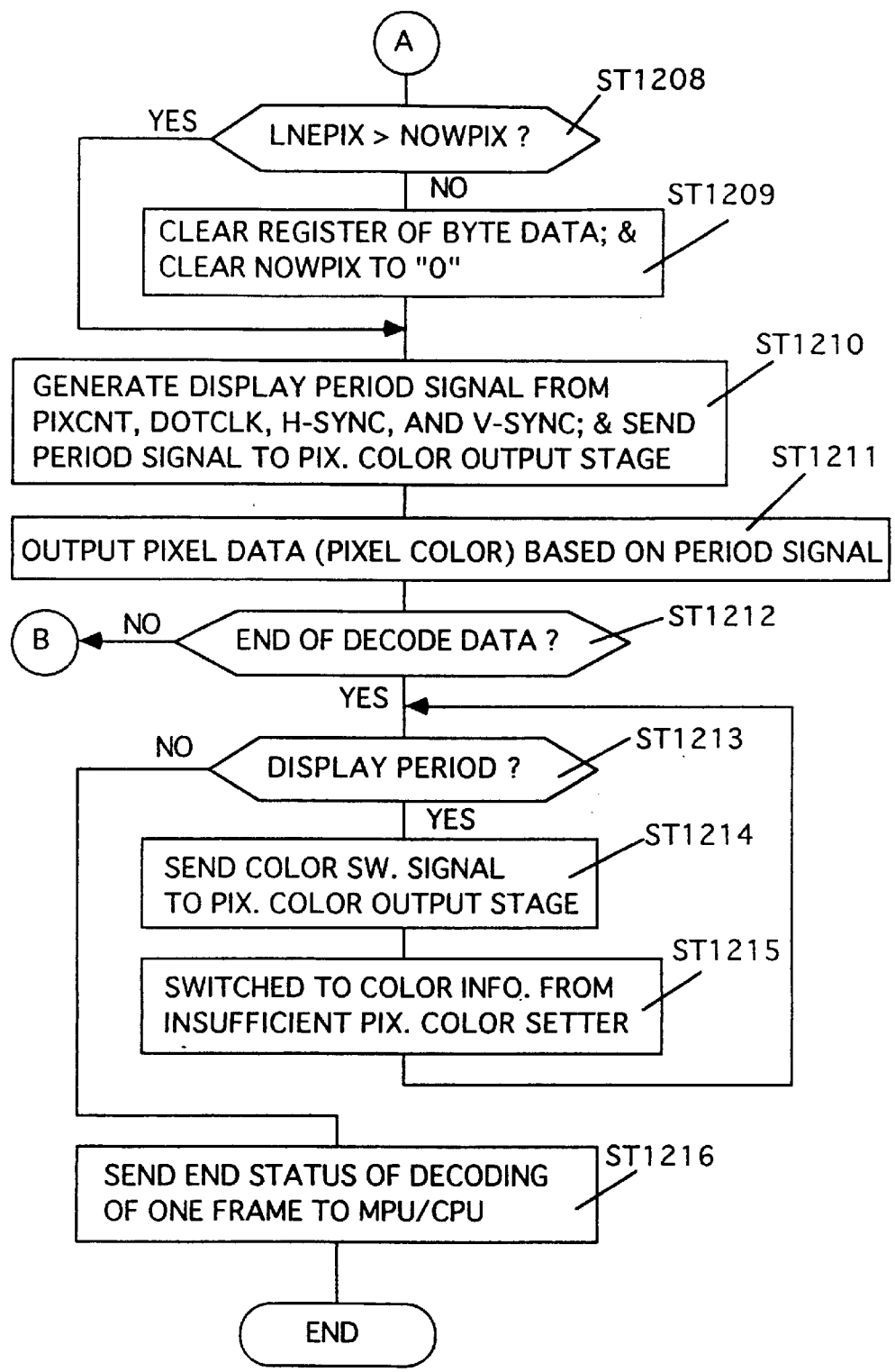
FIG. 19 is a flow chart for explaining the latter processing (subsequent to node A in FIG. 18) of the image decoding (run-length expansion) according to another embodiment of the present invention.

FIG. 19 is a flow chart for explaining the latter processing (subsequent to node A in FIG. 18) of the image decoding (run-length expansion) according to another embodiment of the present invention.

In the former step ST1203, coding data separator 103 is informed, by header separator 113, of the number LNEPIX of pixel data (the number of dots) of one line corresponding to the display width of the sub-picture. Coding data separator 103 checks whether the value NOWPIX of the internal pixel counter of separator 103 exceeds the value LNEPIX of the informed one-line pixel data (step ST1208).

In step ST1208, when the pixel count value NOWPIX is equal to or larger than the one-line pixel data value LNEPIX (NO at step ST1208), the internal register of separator 103, to which one byte data is set, is cleared, and the pixel count value NOWPIX becomes zero (step ST1209). At this time, if the data has been byte-aligned, the trailing 4-bit data is discarded or neglected. On the other hand, when the pixel count value NOWPIX is smaller than the one-line pixel data value LNEPIX (YES at step ST1208), the internal register of separator 103 is not cleared, or the state of the internal register remains.

Run length setter 107 responds to the number PIXCNT (run information) of pixels followed set at the former step ST1207, to dot clock DOTCLK determining the rate of transferring the pixel dots, and to horizontal and vertical-sync signals H-SYNC and V-SYNC for synchronizing the sub-picture to the main picture display. In response to these data or signals, run length setter 107 generates a display period signal (PERIOD SIGNAL) which is provided for enabling pixel color output stage 104 to output for a required period of time the pixel data set in stage 104. The generated PERIOD SIGNAL is sent to pixel color output stage 104 (step ST1210).

Pixel color output stage 104 outputs, as display data of the decoded sub-picture, the separated data (e.g., pixel data indicating the pixel color) set at the former step ST1207 for a period during which the PERIOD SIGNAL is being sent from run length setter 107 to output stage 104 (step ST1211).

Thereafter, the sub-picture display data thus obtained can be properly superimposed to a main picture by a specific circuit block (not shown), and an image of the superimposed main/sub-picture can be displayed on a TV monitor (not shown).

After the output processing of the pixel data at step ST1211 is completed, if the data to be decoded remains, the flow returns to the former step ST1204 (NO at step ST1212).

Whether or not the data to be decoded remains can be determined by checking if coding data separator 103 completes the data processing for the end address (SPEDADR) of the sub-picture display data set by header separator 113.

When no data to be decoded remains, or the data processing up to the end address is completed (YES at step ST1212), it is checked whether a display enable signal (DISPLAY ENABLE) from display activator 110 is active or not. Note that activator 110 generates the active (e.g., high-level) display enable signal unless activator 110 receives a data end signal (DATA END SIGNAL) from address controller 109.

Even when the decoding of current data has already been completed, if the display enable signal is still active, it is determined that the current state is in the display period of the sub-picture (YES at step ST1213). In this case, display activator 110 sends a color switch signal to run-length setter 107 and to pixel color output stage 104 (step ST1214).

At the time when the color switch signal is sent, pixel color output stage 104 already receives insufficient pixel color data from insufficient pixel color setter 111. When output stage 104 receives the color switch signal from display activator 110, the pixel color data to be output is switched to the insufficient pixel color data obtained from insufficient pixel color setter 111 (step ST1215). Then, so long as the display enable signal is active (or in the loop of steps ST1213 to ST1215) during the display period in which no sub-picture data to be decoded exists, the display area for the sub-picture is filled with the insufficient pixel color provided by insufficient pixel color setter 111.

On the other hand, when the display enable signal is inactive, it is determined that the display period for the decoded sub-picture elapses (NO at step ST1213). In this case, display activator 110 supplies microcomputer 112 with an end status indicating that the decoding of the sub-picture (s) of one frame is completed (step ST1216). The decoding of the sub-picture(s) in one screen image (or one frame) is thus completed.

Figure 20:
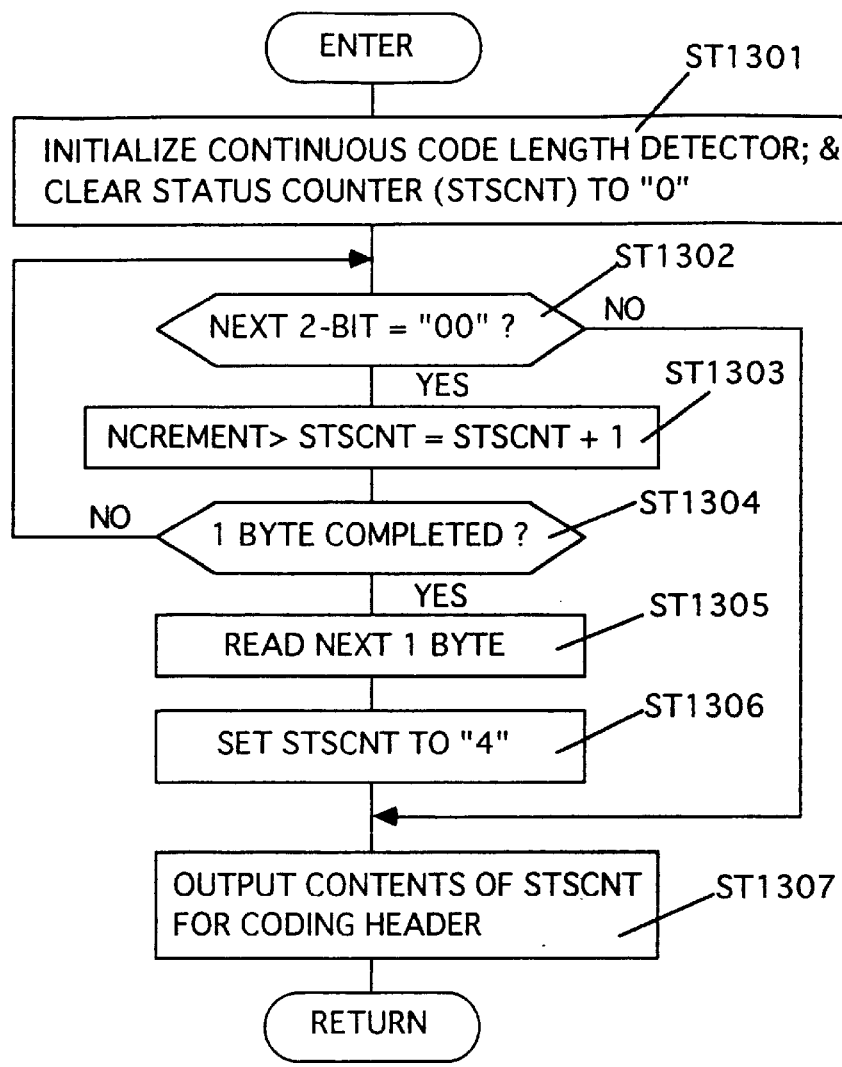
FIG. 20 is a flow chart for exemplifying the content of the coding header detection step ST1205 shown in FIG. 18.

FIG. 20 is a flow chart for exemplifying the content of the coding header detection step ST1205 shown in FIG. 18. The processing of the coding header detection can be executed by continuous code length detector 106 shown in FIG. 17 (or FIG. 11).

First, continuous code length detector 106 is initialized so that its internal status counter (STSCNT; not shown) is set to zero (step ST1301). Then, the contents of two-bit subsequent to the data which has been read from memory 108 to detector 106 in unit of byte are checked. When the contents are "00" (YES at step ST1302), counter STSCNT is incremented by 1 (step ST1303). If the checked two-bit does not reach the end of one byte (NO at step ST1304), the contents of next two-bit are further checked. When the contents are still "00" (YES at step ST1302), counter STSCNT is further incremented by 1 (step ST1303).

After repeating the processing of the loop of steps ST1302 to ST1304, if the checked two-bit reaches the end of one byte (YES at step ST1304), it is determined that the coding header of FIG. 5 is constituted by more than 6 bits. In this case, continuous code length detector 106 reads next one byte data from memory 108 (step ST1305), and status counter STSCNT is set to "4" (step ST1307). At this time, the same one byte data is read by coding data separator 103.

After status counter STSCNT is set to "4", or the contents of two-bit checked at the former step ST1302 is not "00" (NO at step ST1302), the content of status counter STSCNT is established, and the established content is output as the content of the coding header shown in FIG. 5 (step ST1307).

More specifically, when the established content of status counter STSCNT is "0", the coding header of rule 1 of FIG. 5 is detected. When STSCNT="1", the coding header of rule 2 is detected. When STSCNT="2", the coding header of rule 3 is detected. When STSCNT="3", the coding header of rule 4 is detected. When STSCNT="4", the coding header of rule 5 (the same pixel data continues up to the end of line) is detected.

Figure 21:
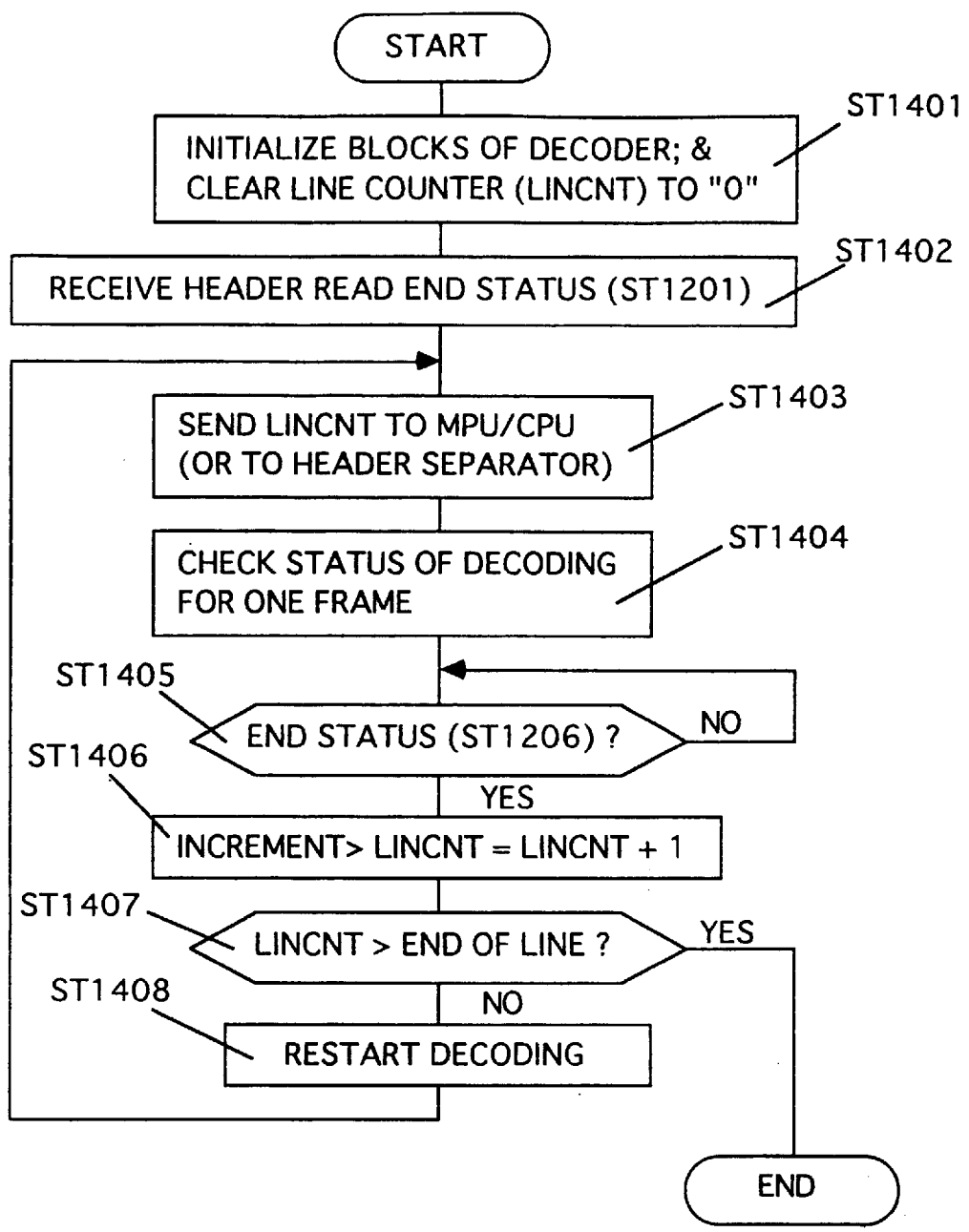
FIG. 21 is a flow chart for explaining the image decode processing according to the present invention, wherein the decoded image is scrolled.

FIG. 21 is a flow chart for explaining the image decode processing according to the present invention, wherein the decoded image is scrolled.

First, the respective blocks in decoder 101 of FIG. 11 or FIG. 17 are initialized, and line counter LINCNT (not shown) is cleared to zero (step ST1401). Then, microcomputer 112 (FIG. 11) or header separator 113 (FIG. 17) receives the header read end status sent at step ST1201 of FIG. 18 (step ST1402).

The content (zero at initial) of line counter LINCNT is sent to microcomputer 112 (FIG. 11) or header separator 113 (FIG. 17) (step ST1403). Microcomputer 112 or header separator 113 checks whether the received status is the end status (step ST1206 of FIG. 18) of one frame or one screen (step ST1404).

If the received status is not the end status of one frame (NO at step ST1405), the processing waits for the end status. When the end status is received (YES at step ST1405), line counter LINCNT is incremented by one (step ST1406).

When the content of incremented counter LINCNT does not reach the end of line (NO at step ST1407), the decode processing of FIGS. 15 and 16, or the decode processing of FIGS. 18 and 19 is restarted (step ST1408), and the processing returns to step ST1403. To repeat the restart of decoding (steps ST1403 to ST1408), the run-length-compressed sub-picture can be scrolled while it is decoded.

Meanwhile, when the content of incremented counter LINCNT reaches the end of line (YES at step ST1407), the decode processing associated with scrolling of the sub-picture is finished.

Figure 22:
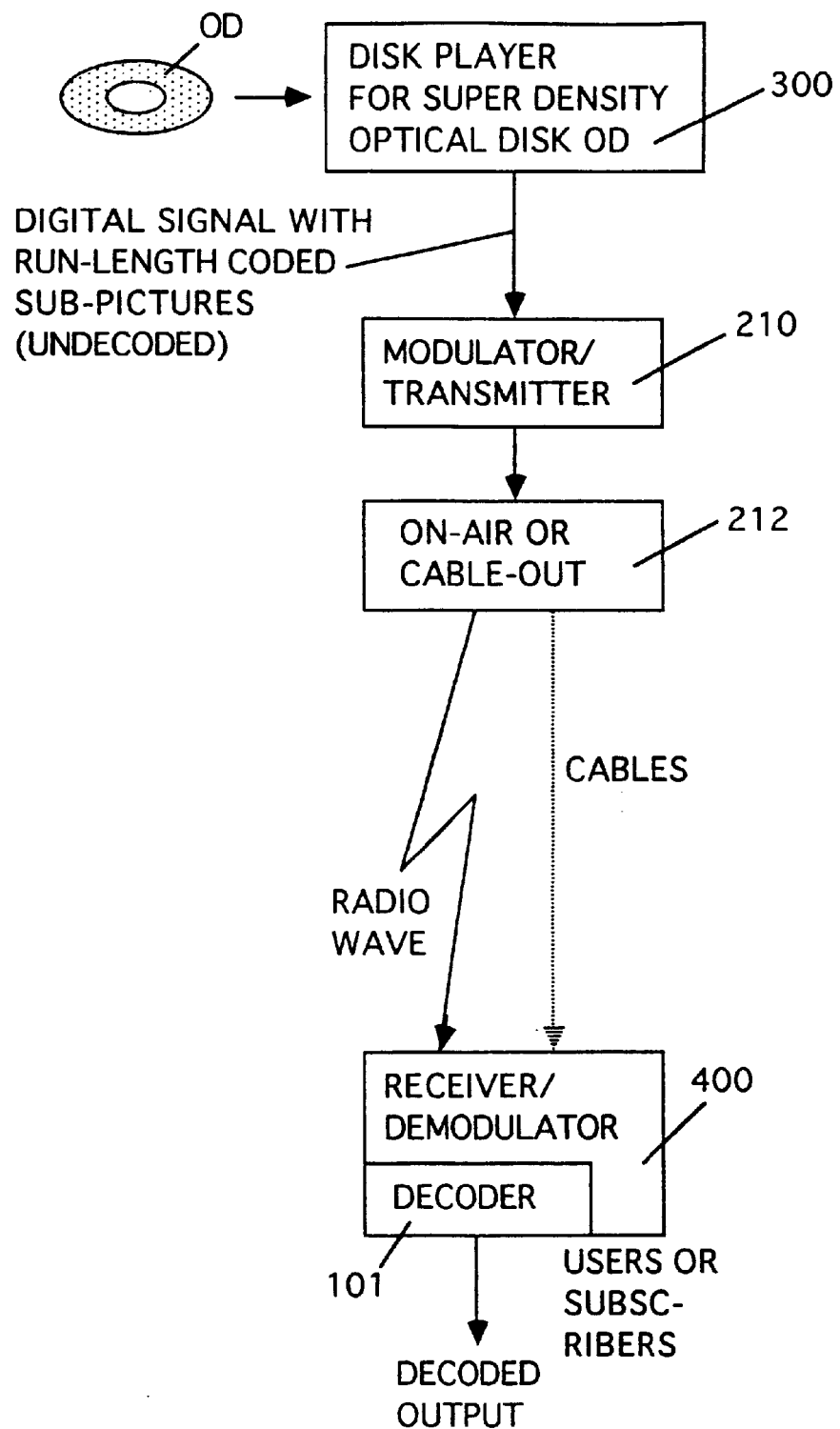
FIG. 22 is a block diagram for explaining a case wherein the compressed data, reproduced from a high-density optical disk having image information encoded according to the present invention, is directly on-aired or output to a cable, and the on-aired or cable-distributed compressed data is decoded at the user side or at the subscriber side.

FIG. 22 is a block diagram for explaining the brief configuration of an optical disk record/playback apparatus in which the encoding and decoding of the present invention are executed.

Optical disk player 300 of FIG. 22 basically has the same configuration as a conventional optical disk playback apparatus (such as a compact disk player or a laser disk player). However, optical disk player 300 has a special configuration that a digital signal, obtained before decoding the run-length-compressed image information (i.e., an encoded digital signal), can be output from inserted optical disk OD on which recorded is image information containing run-length-compressed sub-picture data according to the present invention. Since the encoded digital signal is compressed, the transmission bandwidth necessary to the encoded digital signal can be narrower than that necessary to non-compressed data.

The compressed digital signal from optical disk player 300 is on-aired or is output to a communication cable, via modulator/transmitter 210.

The on-aired compressed digital signal or the cable-output compressed digital signal is received by receiver/demodulator 400 of a user or subscriber. Receiver 400 is provided with decoder 101 having a configuration as shown, for example, in FIG. 11 or FIG. 17. Decoder 101 of receiver 400 decodes the compressed digital signal having been received and demodulated, so as to output image information containing the original sub-picture data before encoded.

In the configuration of FIG. 22, when the transmission system of the transmitter/receiver has an average bit rate of more than about 5M-bit/s, high-quality multi-media video/audio information can be transmitted.

Figure 23:
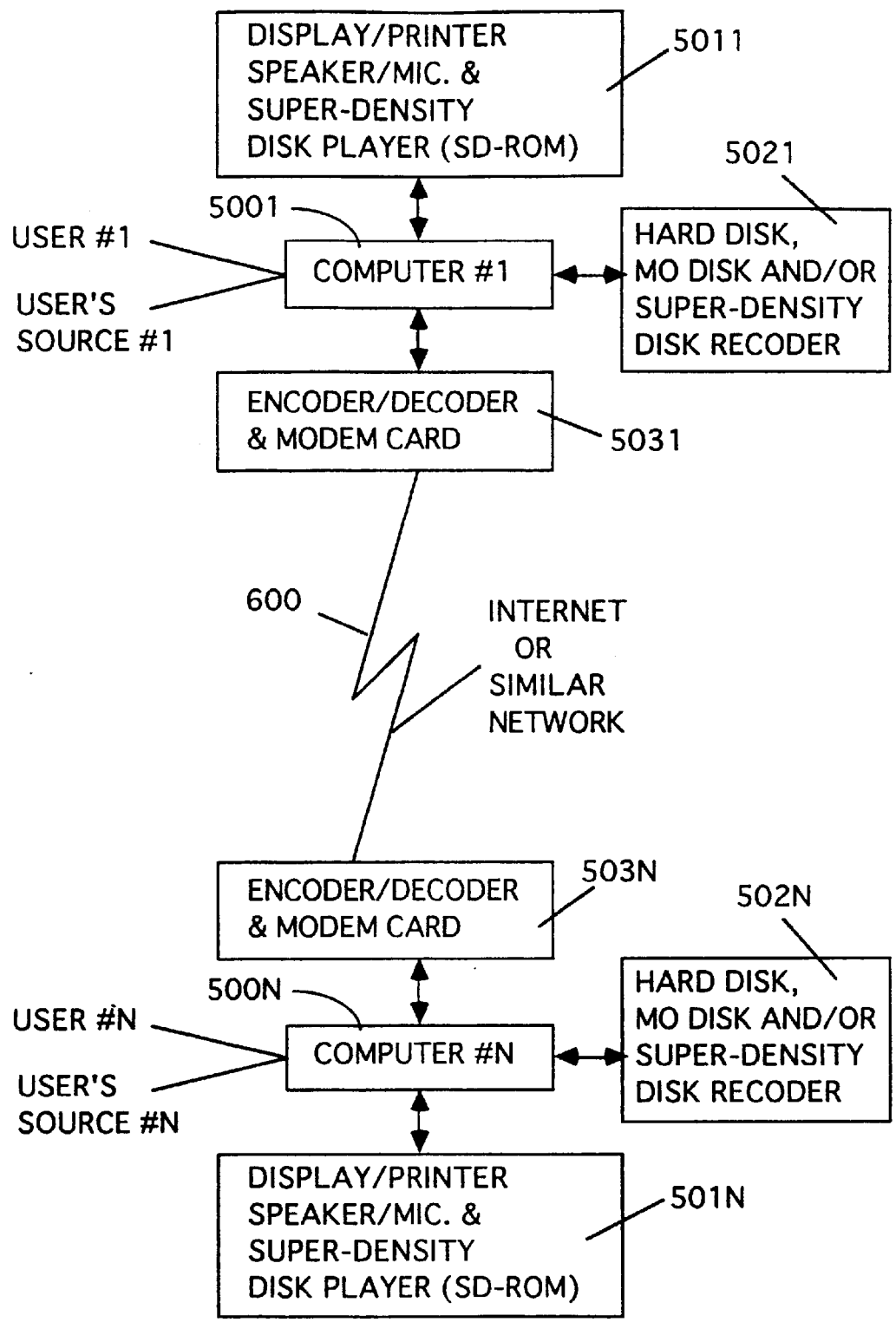
FIG. 23 is a block diagram for explaining a case wherein image information encoded on the basis of the present invention is exchanged between two arbitrary computer users via a communication network (e.g., an internet)

FIG. 23 is a block diagram for explaining a case wherein image information encoded on the basis of the present invention is exchanged between two arbitrary computers through a communication network (e.g., an internet).

User #1 having user's source #1, which is managed by a host computer (not shown), has personal computer 5001. Various input/output devices 5011 and various external memory units 5021 are connected to computer 5001. Modem card 5031 incorporating the encoder and the decoder of the present invention and having a function required for communication is inserted in an internal slot (not shown) of personal computer 5001.

Similarly, user #N having user's source #N has personal computer 500N. Various input/output devices 501N and various external memory units 502N are connected to computer 500N. Modem card 503N incorporating the encoder and the decoder of the present invention and having a function required for communication is inserted in an internal slot (not shown) of personal computer 500N.

Assume that user #1 operates computer 5001 to communicate with computer 500N of another user #N through line 600 such as an internet. In this case, since both users #1 and #N have modem cards 5031 and 503N incorporating the encoders and the decoders, compressed image data can be efficiently exchanged within a short period of time.

Figure 24:
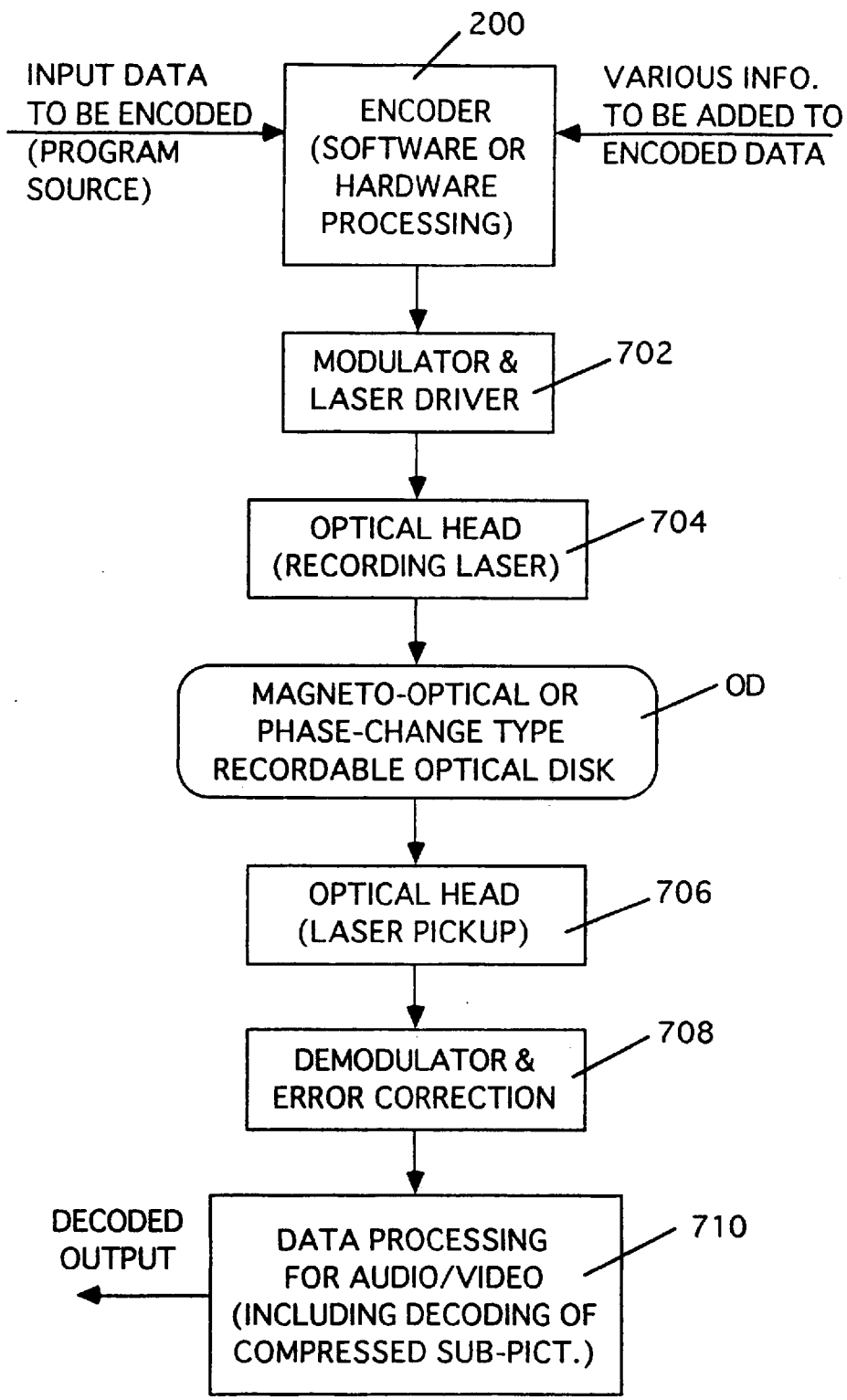
FIG. 24 shows a brief configuration of a record/playback apparatus for recording on optical disk OD the image information encoded according to the present invention, and for playing back the recorded information to decode it according to the present invention.

FIG. 24 shows a brief configuration of a record/playback apparatus for recording on optical disk OD the image information encoded according to the present invention, and for playing back the recorded information to decode it according to the present invention.

Encoder 200 of FIG. 24 is so constructed that it performs the encode processing (corresponding to the processing of FIGS. 13 and 14) similar to the encode processing of encoder 200 of FIG. 10, provided that encoder 200 of FIG. 24 executes the encode processing based on a software or hardware (containing a firmware or wired-logic circuits).

The record signal containing sub-picture data encoded by encoder 200, etc. is subjected to, for example, a (2,7) RLL modulation at modulator/laser driver 702. The modulated record signal is sent from laser driver 702 to a high-power laser diode mounted in optical head 704. A particular pattern corresponding to the record signal is written in a magneto-optical disk or phase-change optical disk OD by means of the recording laser from optical head 704.

Thereafter, the information written in disk OD is read by a laser pickup of optical head 706. The read information is then demodulated at demodulator/error correction circuit 708 in which an error correction is performed, if necessary. The demodulated and error-corrected signal is subjected to various data processing at data processor 710 for audio/video information, so that information, equivalent to the original information before recording, is played back.

Data processor 710 includes a decode processing portion corresponding to, for example, decoder 101 of FIG. 11. This decode processing portion can perform the decoding (i.e., expanding of compressed sub-picture data) of FIGS. 15 and 16.

Figure 25:
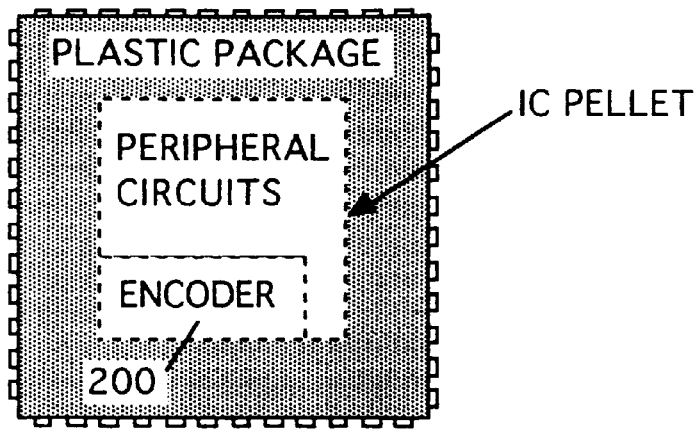
FIG. 25 shows an example of an IC device in which the encoder of the present invention is integrated with its peripheral circuits.

FIG. 25 shows an example of an IC device in which the encoder of the present invention is integrated with its peripheral circuits.

Figure 26:
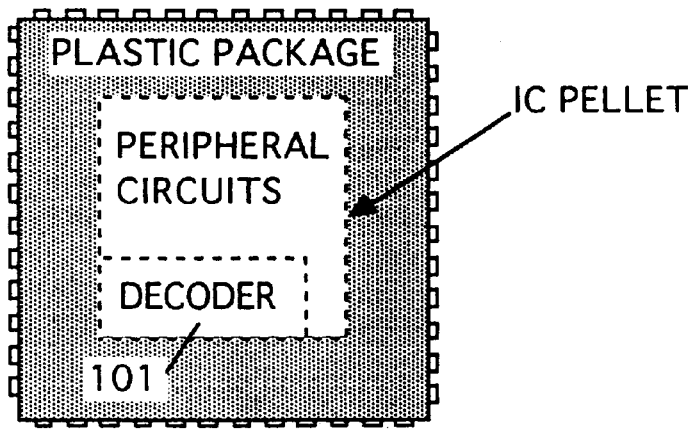
FIG. 26 shows an example of an IC device in which the decoder of the present invention is integrated with its peripheral circuits.

FIG. 26 shows an example of an IC device in which the decoder of the present invention is integrated with its peripheral circuits.

Figure 27:
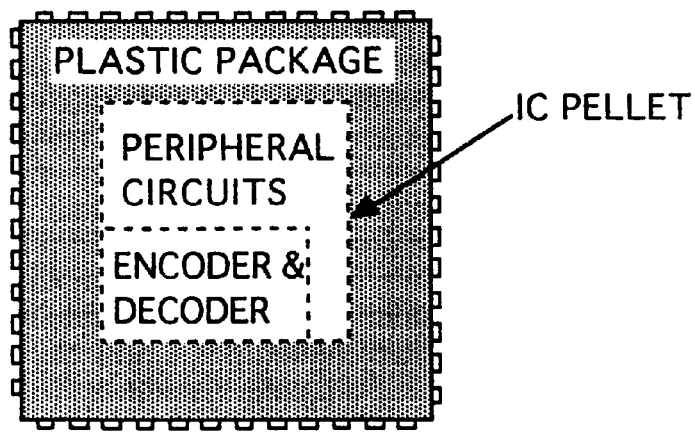
FIG. 27 shows an example of an IC device in which the encoder and decoder of the present invention are integrated with their peripheral circuits.

FIG. 27 shows an example of an IC device in which the encoder and decoder of the present invention are integrated with their peripheral circuits.

Thus, the encoder and/or the decoder according to the present invention can be reduced to practice in a form of a semiconductor integrated circuit (IC). The present invention can be embodied by installing such an IC in various apparatuses.

Generally, the data line on which the bit train of compressed data (PXD) as shown in FIG. 9 is arranged includes the image information of one horizontal scanning line of a TV display screen. However, the data line may include the image information of two or more horizontal scanning lines of the TV display screen, or may include the image information of all horizontal scanning lines of one TV display screen (or one frame of the TV display screen).

Incidentally, the target of data encoding based on the compression rules of the present invention is not limited to the sub-picture data (color information with respect to 3 or 4 colors) explained in the present specification. When the portion of the pixel data is constituted by more bit numbers, various information can be packed in this portion. For instance, if 8-bit per one pixel dot is assigned to the pixel data, 256-color pictures can be transmitted only by the sub-picture (in addition to a main picture).

As has been described above, according to the present invention, instead of performing decoding after reading 1-line data, data is decoded in a small unit by making bit data configurations conform to a plurality of compression rules every time data is read in units of bits. For this reason, according to the present invention, a large code table need not be set in the decoder unlike in the MH coding method. In addition, the same data need not be read twice in an encoding operation unlike in the arithmetic coding method. Furthermore, the decoding side may use a simple counter for counting bit data but requires no multiplier in a decoding operation unlike in the arithmetic coding method. According to the present invention, therefore, decoding processing can be made relatively simple.

Additional advantages and modifications will readily occur to those skilled in the art. Therefore, the invention in its broader aspects is not limited to the specific details, representative devices, and illustrated examples shown and described herein. Accordingly, various modifications may be made without departing from the spirit or scope of the general inventive concept as defined by the appended claims and their equivalents.

What is claimed is:

1. A data compression technique for compressing a bit train of continuous pixels based on a run-length coding scheme, comprising:

generating run-length information representing a number of continuous same data bits;

providing pixel data, constituted by at least two binary bits for defining at least three different kinds of pixels; and grouping the run-length information and the pixel data as a single compression unit.

2. The method of claim 1, wherein the pixel data bas a fixed bit length of two bits, and the run-length information has a variable length.

3. A recording apparatus for recording an information integral body which is formed of a plurality of pixel data each defined by a predetermined number of bits, wherein a data block, containing same continuous pixel data, is compressed as one unit of compression, said recording apparatus comprising:

compression data generating means for generating a compressed unit data block in accordance with a coding header corresponding to a continuing number of the same pixel data in the data block of the one compression unit, with a number of pixels followed indicating the continuing number of the same pixel data, and with data representing the same pixel data in the data block of the one compression unit; and recording means for recording on a prescribed recording medium the compressed unit data block generated by said compression data generating means.

4. The apparatus of claim 1, wherein said compression data generating means includes:

means for assigning no bits to the coding header when a data length of the continuing number of the same pixel data is not higher than four; and means for assigning two or more but less than a predetermined number of bits to the coding header when the data length of the continuing number of the same pixel data is equal to or higher than four but less than a prescribed number.

5. The apparatus of claim 1, wherein the information integral body is arranged on a data line of a finite bit length, and said compression data generating means includes:

means for constituting the coding header by a specific number of bits which indicates that the same pixel data continues up to an end of the data line, when the same pixel data in the data block of one unit of compression continues up to the end of the data line.

6. The apparatus of claim 1, wherein the information integral body is arranged on a data line of a finite bit length, and said compression data generating means includes:

means for constituting the coding header by a specific number of bits which indicates that the same pixel data continues up to an end of the data line, when the same pixel data in the data block of one unit of compression continues up to the end of the data line;

means for assigning no bits to the coding header when a data length of the continuing number of the same pixel data is not higher than four; and means for assigning two or more but less than a predetermined number of bits to the coding header when the data length of the continuing number of the same pixel data is equal to or higher than four but less than a prescribed number.

7. The apparatus of claim 1, wherein the information integral body is arranged on a data line of a finite bit length, said apparatus further comprising:

means for adding dummy bit data to the data block of the one compression unit so that a total bit length of the data block of the one compression unit becomes a multiple of eight bits, if the total bit length is not a multiple of eight when generation of the data block of the one compression unit on the data line is completed.

8. The apparatus of claim 1, wherein the information integral body is arranged on a data line of a finite bit length, said apparatus further comprising:

means for assigning no bits to the coding header when a data length of the continuing number of the same pixel data is not higher than four;

means for assigning two or more but less than a predetermined number of bits to the coding header when the data length of the continuing number of the same pixel data is equal to or higher than four but less than a prescribed number; and means for adding dummy bit data to the data block of the one compression unit so that a total bit length of the data block of the one compression unit becomes a multiple of eight bits, if the total bit length is not a multiple of eight when generation of the data block of the one compression unit on the data line is completed.

9. The apparatus of claim 1, wherein the information integral body is arranged on a data line of a finite bit length, said apparatus further comprising:

means for constituting the coding header by a specific number of bits which indicates that the same pixel data continues up to an end of the data line, when the same pixel data in the data block of one unit of compression continues up to the end of the data line; and means for adding dummy bit data to the data block of the one compression unit so that a total bit length of the data block of the one compression unit becomes a multiple of eight bits, if the total bit length is not a multiple of eight when generation of the data block of the one compression unit on the data line is completed.

10. The apparatus of claim 3, wherein the information integral body is arranged on a data line of a finite bit length, said apparatus further comprising:

means for constituting the coding header by a specific number of bits which indicates that the same pixel data continues up to an end of the data line, when the same pixel data in the data block of one unit of compression continues up to the end of the data line; and means for adding dummy bit data to the data block of the one compression unit so that a total bit length of the data block of the one compression unit becomes a multiple of eight bits, if the total bit length is not a multiple of eight when generation of the data block of the one compression unit on the data line is completed.

11. A apparatus of recording an information integral body which is formed of a plurality of pixel data each defined by a predetermined number of bits, wherein a data block, containing same continuous pixel data, is compressed as one unit of compression, and wherein the information integral body is arranged on a data line of a finite bit length, said encoding apparatus comprising:

a first means for specifying the data block of the one compression unit of the information integral body;

a second means for generating a compressed unit data block based on a coding header, a number of pixels followed, and pixel data, wherein no bits are assigned to the coding header when a number of the same continuous pixel data is equal to or less than a first predetermined number, and two or more bits but less than a prescribed number of bits are assigned to the coding header when the number of the same continuous pixel data is greater then the first predetermined number but less than a second predetermined number, wherein the number of pixels followed indicates the number of the same continuous pixel data, and wherein the pixel data indicates the same pixel data in the data block of the one compression unit;

a third means for constituting the coding header by a specific number of bits which indicates that the same pixel data continues up to an end of the data line, when the same pixel data in the data block of one unit of compression continues up to the end of the data line; and a fourth means for adding dummy bit data to the data block of the one compression unit so that a total bit length of the data block of the one compression unit becomes a multiple of eight bits, if the total bit length is not a multiple of eight when generation of the data block of the one compression unit on the data line is completed.

12. The apparatus of claim 11, wherein no bits are assigned to the coding header when a data length of the same continuous pixel data in the data block of the one unit of compression is less than four;

two bits are assigned to the coding header when the data length of the same continuous pixel data in the data block of the one unit of compression is equal to or greater then four but less than 16;

four bits are assigned to the coding header when the data length of the same continuous pixel data in the data block of the one unit of compression is equal to or greater then 16 but less than 64;

six bits are assigned to the coding header when the data length of the same continuous pixel data in the data block of the one unit of compression is equal to or greater then 64 but less than 256; and fourteen bits are assigned to the coding header when the same pixel data in the data block of one unit of compression continues up to the end of the data line.

13. The apparatus of claim 11, wherein said second means includes means for performing the following:

no bits are assigned to the coding header and two bits are assigned to the number of pixels followed, when a data length of the same continuous pixel data in the data block of the one unit of compression is less than four;

two bits are assigned to the coding header and four bits are assigned to the number of pixels followed, when the data length of the same continuous pixel data in the data block of the one unit of compression is equal to or greater then four but less than 16;

four bits are assigned to the coding header and six bits are assigned to the number of pixels followed, when the data length of the same continuous pixel data in the data block of the one unit of compression is equal to or greater then 16 but less than 64;

six bits are assigned to the coding header and eight bits are assigned to the number of pixels followed, when the data length of the same continuous pixel data in the data block of the one unit of compression is equal to or greater then 64 but less than 256; and fourteen bits are assigned to the coding header but no bits are assigned to the number of pixels followed, when the same pixel data in the data block of one unit of compression continues up to the end of the data line.

14. A playing back apparatus for playing back a bit train of a unit of a compressed data block, obtained by compressing same continuous pixel data as one unit of compression, from a recording medium, wherein the compressed data block corresponds to at least part of an information integral body formed by a plurality of pixel data each defined by a predetermined number of bits, and wherein the compressed data block includes either a coding header indicating data of a number of pixels followed, which number data corresponds to the number of the same continuous pixel data, or a coding header indicating the number data of pixels followed as well as the same continuous pixel data, said playing back apparatus comprising:

a coding header detecting means for detecting the coding header from the data block of the one compression unit contained in the information integral body;

a continuous pixel number detecting means for detecting the number data of the pixels followed, from the data block of the one compression unit, in accordance with a content of the coding header detected by said coding header detecting means;

a pixel data determining means for determining a content of the pixel data in an uncompressed data block of the one compression unit, in accordance with a remainder of the data block of the one compression unit, from which removed are the coding header detected by said coding header detecting means and the number data of the pixels followed detected by said continuous pixel number detecting means; and a pixel pattern restoration means for arranging bit data of the content determined by said pixel data determining means, by a number indicated by the number data of the pixels followed detected by said continuous pixel number detecting means, so as to restore a pattern of uncompressed pixel data of the one compression unit.

15. The apparatus of claim 14, wherein said continuous pixel number detecting means immediately fetches a predetermined number of bits as the number data of the pixels followed, when no bits are assigned to the coding header detected by said coding header detecting means.

16. The apparatus of claim 14, wherein the information integral body is arranged on a data line of a finite bit length, and when the coding header includes a specific number of bits indicating that the same pixel data continues up to an end of the data line, said apparatus further comprising:

means for continuously outputting, up to the end of the data line, bit data having the content determined by said pixel data determining means.

17. The apparatus of claim 14, wherein the information integral body is arranged on a data line of a finite bit length, and when the coding header includes a specific number of bits indicating that the same pixel data continues up to an end of the data line, said apparatus further comprising:

means for continuously outputting, up to the end of the data line, bit data having the content determined by said pixel data determining means, and wherein said continuous pixel number detecting means immediately fetches a predetermined number of bits as the number data of the pixels followed, when no bits are assigned to the coding header detected by said coding header detecting means.

18. The apparatus of claim 14, wherein the information integral body is arranged on a data line of a finite bit length, and when a total bit length of all of the data blocks of the compression unit on the data line has been adjusted to a multiple of eight bits by adding dummy bit data, removing the dummy bit data.

19. The apparatus of claim 14, wherein said continuous pixel number detecting means immediately fetches a predetermined number of bits as the number data of the pixels followed, when no bits are assigned to the coding header detected by said coding header detecting means, and wherein said continuous pixel number detecting means fetches a specific number of bits after the coding header as the number data of the pixels followed, when bits within a predetermined range of bit numbers are assigned to the coding header detected by said coding header detecting means.

20. The apparatus of claim 14, wherein the information integral body is arranged on a data line of a finite bit length, and when the coding header includes a specific number of bits indicating that the same pixel data continues up to an end of the data line, said apparatus further comprising:

means for arranging, up to the end of the data line, bit data having the content determined by said pixel data determining means.

21. The apparatus of claim 14, wherein the information integral body is arranged on a data line of a finite bit length, and when the coding header includes a specific number of bits indicating that the same pixel data continues up to an end of the data line, said apparatus further comprising:

means for arranging, up to the end of the data line, bit data having the content determined by said pixel data determining means; and means for adjusting a total bit length of all of the data blocks of the compression unit on the data line to a multiple of eight bits, if the total bit length is not a multiple of eight when said pixel pattern restoration means restores all data blocks of the compression unit on the data line.

22. A playing back apparatus for playing back a bit train of a unit of a compressed data block, obtained by compressing same continuous pixel data as one unit of compression, from an optical disk, and expanding the played back bit train, wherein the compressed data block corresponds to at least part of an information integral body formed by a plurality of pixel data each defined by a predetermined number of bits, and wherein the compressed data block includes either a coding header indicating data of a number of pixels followed, which number data corresponds to the number of the same continuous pixel data, or a coding header indicating the number data of pixels followed as well as the same continuous pixel data, said playing back apparatus comprising:

a first means for detecting a coding header from the data block of the one compression unit contained in the information integral body;

a second means for immediately fetching a predetermined number of bits as number data of the pixels followed, when no bits are assigned to the coding header detected by said first means;

a third means for detecting, from the data block of the one compression unit, the number data of the pixels followed in accordance with a content of the coding header, when prescribed bits are assigned to the coding header detected by said first means;

a fourth means for determining a content of the pixel data in an uncompressed data block of the one compression unit, in accordance with a remainder of the data block of the one compression unit, from which removed are the coding header detected by said first means and the number data of the pixels followed detected by either said second means or said third means;

a fifth means for arranging bit data of the content determined by said fourth means, by a number indicated by the number data of the pixels followed detected by either said second means or said third means, so as to restore a pattern of uncompressed pixel data of the one compression unit; and a sixth means for arranging, up to the end of the data line, a content of bits subsequent to the coding header, when the information integral body is arranged on a data line of a finite bit length, and when the coding header includes a specific number of bits indicating that the same pixel data continues up to an end of the data line.

23. The apparatus of claim 22, wherein it is determined that a data length of the same continuous pixel data in the one compression unit is less than four, when no bits are assigned to the coding header;

it is determined that the data length of the same continuous pixel data in the one compression unit is equal to or greater then four but less than 16, when two bits are assigned to the coding header;

it is determined that the data length of the same continuous pixel data in the one compression unit is equal to or greater then 16 but less than 64, when four bits are assigned to the coding header;

it is determined that the data length of the same continuous pixel data in the one compression unit is equal to or greater then 64 but less than 256, when six bits are assigned to the coding header; and it is determined that the same continuous pixel data in the one compression unit continues up to the end of the data line, when 14 bits are assigned to the coding header.

* * * * *